United States Patent
Kim et al.

(10) Patent No.: US 11,626,181 B2
(45) Date of Patent: Apr. 11, 2023

(54) SEMICONDUCTOR MEMORY DEVICES AND METHODS OF OPERATING SEMICONDUCTOR MEMORY DEVICES

(71) Applicant: Samsung Electronics Co., Ltd., Suwon-si (KR)

(72) Inventors: Kiheung Kim, Suwon-si (KR); Sanguhn Cha, Suwon-si (KR); Junhyung Kim, Suwon-si (KR); Sungchul Park, Seoul (KR); Hyojin Jung, Hwaseong-si (KR); Kyung-Soo Ha, Hwaseong-si (KR)

(73) Assignee: Samsung Electronics Co., Ltd.

(*) Notice: Subject to any disclaimer, the term of this patent is extended or adjusted under 35 U.S.C. 154(b) by 0 days.

(21) Appl. No.: 17/245,075

(22) Filed: Apr. 30, 2021

(65) Prior Publication Data
US 2022/0093200 A1    Mar. 24, 2022

(30) Foreign Application Priority Data
Sep. 22, 2020  (KR) .................. 10-2020-0122514

(51) Int. Cl.
| | | |
|---|---|---|
| *G11C 29/42* | (2006.01) | |
| *G11C 11/406* | (2006.01) | |
| *G11C 29/20* | (2006.01) | |
| *G11C 29/44* | (2006.01) | |

(52) U.S. Cl.
CPC ........ *G11C 29/42* (2013.01); *G11C 11/40615* (2013.01); *G11C 29/20* (2013.01); *G11C 29/44* (2013.01)

(58) Field of Classification Search
CPC .............. G11C 11/2273; G11C 11/221; G11C 11/2259; G11C 11/2275; G11C 11/5657
See application file for complete search history.

(56) References Cited

U.S. PATENT DOCUMENTS

| | | | |
|---|---|---|---|
| 6,101,614 | A  | 8/2000 | Gonzales et al. |
| 8,640,006 | B2 | 1/2014 | Carman et al. |
| 9,442,801 | B2 | 9/2016 | Benedict et al. |
| 9,552,175 | B2 | 1/2017 | Takefman et al. |
| 9,600,362 | B2 | 3/2017 | Kang et al. |

(Continued)

OTHER PUBLICATIONS

"Extended European Search Report for European Application No. 21179736.0 dated Dec. 14, 2021, 10 pages".

*Primary Examiner* — Tuan T Nguyen
(74) *Attorney, Agent, or Firm* — Myers Bigel, P.A.

(57) ABSTRACT

A semiconductor memory device includes a memory cell array, an error correction code (ECC) circuit, a fault address register, a scrubbing control circuit and a control logic circuit. The memory cell array includes memory cell rows. The scrubbing control circuit generates scrubbing addresses based on refresh operations performed on the memory cell array. The control logic circuit controls the ECC circuit such that the ECC circuit performs an error detection operation on a plurality of sub-pages in a first memory cell row to count a number of error occurrences, and determines whether to correct a codeword in which an error is detected based on the number of error occurrences. An uncorrected or corrected codeword is written back, and a row address of the first memory cell row may be stored in the fault address register as a row fault address based on the number of error occurrences.

20 Claims, 23 Drawing Sheets

(56) References Cited

U.S. PATENT DOCUMENTS

| | | |
|---|---|---|
| 10,601,682 B2 | 3/2020 | Chen et al. |
| 11,436,079 B2 * | 9/2022 | Cha ..................... G06F 11/1068 |
| 11,437,115 B2 * | 9/2022 | Kim ....................... G11C 29/42 |
| 2014/0146624 A1 | 5/2014 | Son et al. |
| 2017/0161144 A1 | 6/2017 | Reed et al. |
| 2018/0342284 A1 | 11/2018 | Jin et al. |
| 2019/0371391 A1 | 12/2019 | Cha et al. |
| 2021/0208965 A1 * | 7/2021 | Cha ....................... G11C 11/406 |
| 2021/0208967 A1 * | 7/2021 | Cha ....................... H03M 13/13 |

* cited by examiner

SEMICONDUCTOR MEMORY DEVICES AND METHODS OF OPERATING SEMICONDUCTOR MEMORY DEVICES

CROSS-REFERENCE TO RELATED APPLICATIONS

This application claims the benefit of priority under 35 U.S.C. § 119 to Korean Patent Application No. 10-2020-0122514, filed on Sep. 22, 2020, in the Korean Intellectual Property Office, the disclosure of which is incorporated by reference in its entirety herein.

BACKGROUND

Aspects of the present disclosure relate to memory devices, and more particularly to semiconductor memory devices, and to methods of operating semiconductor memory devices.

Semiconductor memory devices may be classified into non-volatile memory devices, such as flash memory devices, and volatile memory devices, such as DRAMs. High speed operation and cost efficiency of DRAMs make it possible for DRAMs to be used for system memories. Due to the continuing shrink in fabrication design rules for DRAMs, bit errors of memory cells in the DRAMs may rapidly increase and yield of the DRAMs may decrease. Therefore, there is a need for improved reliability and/or credibility of the semiconductor memory device.

SUMMARY

Some aspects of the present disclosure provide semiconductor memory devices having improved or increased reliability, credibility and/or performance.

Some example embodiments provide a method of operating a semiconductor memory device, capable of increasing reliability, credibility and/or performance.

According to some example embodiments, a semiconductor memory device includes a memory cell array, an error correction code (ECC) circuit, a fault address register, a scrubbing control circuit and a control logic circuit. The memory cell array includes a plurality of memory cell rows and each of the plurality of memory cell rows includes volatile memory cells. The scrubbing control circuit is configured to generate a scrubbing address for a scrubbing operation on a first memory cell row selected from the plurality of memory cell rows. The scrubbing address is generated based on refresh operations performed on the memory cell rows. The control logic circuit is configured to control the ECC circuit and the scrubbing control circuit, and control the ECC circuit such that the ECC circuit performs an error detection operation on a plurality of sub-pages in the first memory cell row to count a number of error occurrences in the first memory cell row during a first interval of the scrubbing operation, selectively correct a codeword in which an error is detected based on the number of error occurrences in the first memory cell row, resulting in a corrected codeword or uncorrected codeword, write back the corrected codeword or the uncorrected codeword during a second interval of the scrubbing operation, and store a row address of the first memory cell row in the fault address register as a row fault address in response to the number of error occurrences in the first memory cell row being equal to or greater than a reference value.

According to some example embodiments, there is provided a method of operating a semiconductor memory device including a memory cell array that includes a plurality of memory cell rows. According to the method, a first memory cell row is selected from the plurality of memory cell rows based on refresh row addresses for refreshing the memory cell rows, an error detection operation is, by an error correction code (ECC) circuit, performed on a plurality of sub-pages in the first memory cell row by unit of codeword and a number of error occurrences in the first memory cell row is counted, whether to correct a codeword in which an error is detected is determined based on the number of error occurrences in the first memory cell row, and the codeword in which the error is detected is written back to the memory cell array with our without correction based on the determining.

According to some example embodiments, a semiconductor memory device includes a memory cell array, an error correction code (ECC) circuit, a fault address register, a refresh control circuit, a scrubbing control circuit and a control logic circuit. The memory cell array includes a plurality of memory cell rows and each of the plurality of memory cell rows includes volatile memory cells. The refresh control circuit is configured to generate refresh row addresses for refreshing the memory cell rows. The scrubbing control circuit is configured to generate, based on counting the refresh row addresses, scrubbing addresses for performing a scrubbing operation on a first memory cell row selected from the plurality of memory cell rows. The control logic circuit is configured to control the ECC circuit and the scrubbing control circuit, controls the ECC circuit such that the ECC circuit performs an error detection operation on a plurality of sub-pages in the first memory cell row to count a number of error occurrences during a first interval in the scrubbing operation, determines whether to correct a codeword in which an error is detected based on the number of error occurrences, store a row address of the first memory cell row in the fault address register as a row fault address in response to the number of error occurrences in the first memory cell row being equal to or greater than a reference value, and control the ECC circuit to skip an ECC decoding on a memory cell row designated by an access address from an external source when the access address matches the row fault address and when the access address is associated with a read command.

Accordingly, in some embodiments a semiconductor memory device includes an ECC circuit, a scrubbing control circuit and a fault address register. The ECC circuit may be configured to sequentially perform error detection operation on codewords in a memory cell row designated by a scrubbing address provided from the scrubbing control circuit and count a number of error occurrences. The ECC circuit may store a row address of the memory cell row in the fault address register as a row fault address when the counted number of error occurrences is equal to or greater than the reference value. The ECC circuit may skip error correction and writes back an uncorrected codeword. Therefore, the semiconductor memory device may prevent error bits from being accumulated and may enhance reliability, credibility and/or performance.

BRIEF DESCRIPTION OF THE DRAWINGS

Example embodiments will be described below in more detail with reference to the accompanying drawings.

DETAILED DESCRIPTION

Various example embodiments will be described more fully hereinafter with reference to the accompanying drawings, in which some example embodiments are shown.

Figure 1:
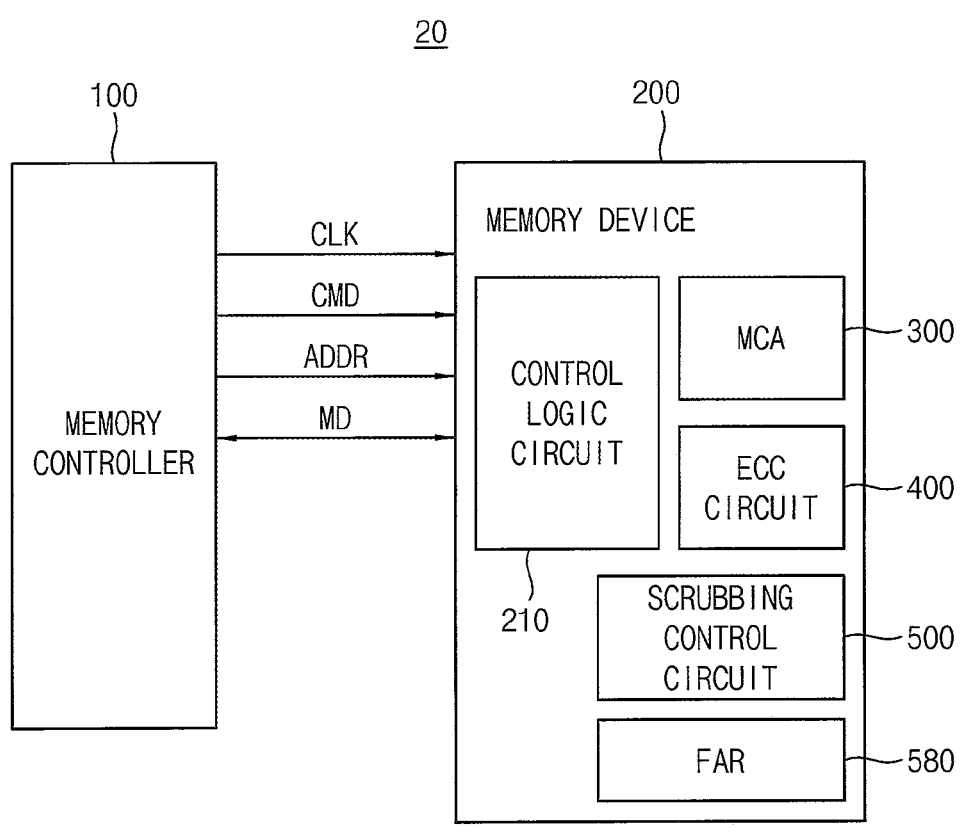
FIG. 1 is a block diagram illustrating a memory system according to some example embodiments.

FIG. 1 is a block diagram illustrating a memory system according to some example embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host (not shown) and the semiconductor memory device 200. For example, the memory controller 100 may write data in the semiconductor memory device 200 and/or read data from the semiconductor memory device 200 in response to request from the external host.

In addition, the memory controller 100 may issue operation commands to the semiconductor memory device 200 for controlling the semiconductor memory device 200. The memory controller 100 may transmit a clock signal CLK, a command CMD, and an address (signal) ADDR to the semiconductor memory device 200, and may exchange main data MD with the semiconductor memory device 200.

In some example embodiments, the semiconductor memory device 200 is a memory device including dynamic memory cells such as a dynamic random access memory (DRAM), double data rate 4 (DDR4) synchronous DRAM (SDRAM), DDR5 SDRAM a low power DDR4 (LPDDR4) SDRAM, a LPDDR5 SDRAM or a LPDDR6 DRAM.

The semiconductor memory device 200 may include a memory cell array 300 that stores the main data MD and parity data, an error correction code (ECC) circuit 400, a control logic circuit 210, a scrubbing control circuit 500 and a fault address register FAR 580.

The ECC circuit 400 may perform encoding or ECC encoding on write data to be stored in a target page of the memory cell array 300, and may perform decoding or ECC decoding on a codeword read from the target page under control of the control logic circuit 210.

The scrubbing control circuit 500 may generate scrubbing addresses for performing a scrubbing operation on a first memory cell row of a plurality of memory cell rows. For example, a scrubbing address may be generated, and the scrubbing operation may be performed, whenever a refresh operation is performed on N memory cell rows of the plurality of memory cell rows included in the memory cell array 300. Here, N is a natural number equal to or greater than three.

The scrubbing operation may include at least first and second intervals. The scrubbing operation may include an error detection operation performed during the first interval of the scrubbing operation, and a selective error correction and write-back operation performed during the second interval of the scrubbing operation.

The control logic circuit 210 may control the ECC circuit 400 such that the ECC circuit 400 performs an error detection operation on a plurality of sub-pages in the first memory cell row by unit of codeword to count a number of error occurrences to during the first interval in the scrubbing operation. The control logic circuit 210 may control the ECC circuit 400 such that, during the second interval of the scrubbing operation, the ECC circuit 400 determines whether to correct a codeword in which an error is detected based on the number of error occurrences and write back the corrected codeword, or whether to write back the uncorrected codeword and store a row address of the first memory cell row in the fault address register 580 as a row fault address.

The control logic circuit 210 may control the ECC circuit 400 to correct the error and to write back the corrected codeword in a corresponding sub-page in the first memory cell row in response to the number of error occurrences being smaller than the reference value. The control logic circuit 210 may control the ECC circuit 400 not to correct the error and to write back the uncorrected codeword in a corresponding sub-page in the first memory cell row in response to the number of error occurrences being equal to or greater than the reference value. In some example embodiments, the control logic circuit 210 may control the ECC circuit 400 to skip ECC decoding on codewords in a corresponding memory cell row if the number of error occurrences associated with the memory cell row is equal to or greater than the reference value.

An access address associated with a read command may be received from the memory controller. If the access address matches a row fault address stored in the fault address register 580, the control logic circuit 210 may control the ECC circuit 400 to skip an ECC decoding on the memory cell row designated by the access address.

Figure 2:
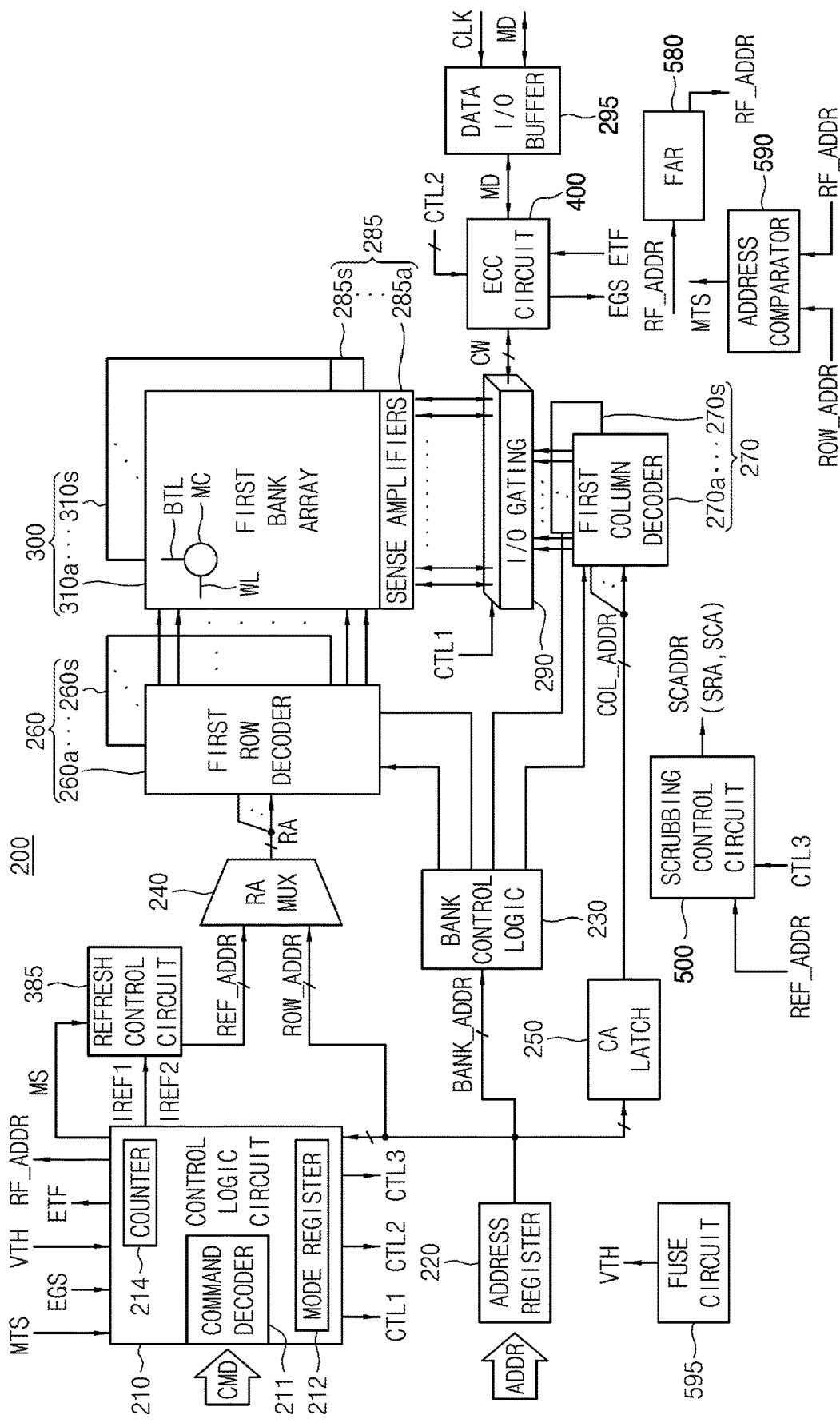
FIG. 2 is a block diagram illustrating the semiconductor memory device in FIG. 1 according to some example embodiments.

FIG. 2 is a block diagram illustrating the semiconductor memory device 200 in FIG. 1 according to some example embodiments.

Referring to FIG. 2, the semiconductor memory device 200 may include the control logic circuit 210, an address register 220, a bank control logic 230, a refresh control circuit 385, a row address multiplexer 240, a column address latch 250, a row decoder 260, a column decoder 270, the memory cell array 300, a sense amplifier unit 285, an I/O gating circuit 290, the ECC circuit 400, the scrubbing control circuit 500, a data I/O buffer 295, the fault address register 580, an address comparator 590 and a fuse circuit 595.

The memory cell array 300 may include a plurality of bank arrays 310a~310s. The row decoder 260 may include a plurality of bank row decoders 260a~260s respectively coupled to the plurality of bank arrays 310a~310s, the column decoder 270 may include a plurality of bank column decoders 270a~270s respectively coupled to the plurality of bank arrays 310a~310s, and the sense amplifier unit 285 may include plurality of bank sense amplifiers 285a~285s respectively coupled to the plurality of bank arrays 310a~310s.

The plurality of bank arrays 310a~310s, the plurality of bank row decoders 260a~260s, the plurality of bank column decoders 270a~270s and plurality of bank sense amplifiers 285a~285s may form a plurality of banks. Each bank of the plurality of banks may include a respective bank array 310, bank row decoder 260, bank column decoder 270, and bank sense amplifier 285. Each of the plurality of bank arrays 310a~310s may include a plurality of memory cells MC formed at intersections of a plurality of word-lines WL and a plurality of bit-line BTL.

The address register 220 may receive the address ADDR including a bank address BANK_ADDR, a row address ROW_ADDR and a column address COL_ADDR from the memory controller 100. The address register 220 may provide the received bank address BANK_ADDR to the bank control logic 230, the received row address ROW_ADDR to the row address multiplexer 240, and the received column address COL_ADDR to the column address latch 250.

The bank control logic 230 may generate bank control signals in response to the bank address BANK_ADDR. One of the plurality of bank row decoders 260a~260s corresponding to the bank address BANK_ADDR may be activated in response to the bank control signals, and one of the plurality of bank column decoders 270a~270s corresponding to the bank address BANK_ADDR may be activated in response to the bank control signals.

The row address multiplexer 240 may receive the row address ROW_ADDR from the address register 220, and receives a refresh row address REF_ADDR from the refresh control circuit 385. The row address multiplexer 240 selectively outputs the row address ROW_ADDR or the refresh row address REF_ADDR as a row address RA. The row address RA that is output from the row address multiplexer 240 is applied to the plurality of bank row decoders 260a~260s.

The refresh control circuit 385 may sequentially output the refresh row address REF_ADDR in response to a first refresh control signal IREF1 or a second refresh control signal IREF2 from the control logic circuit 210.

When the command CMD from the memory controller 100 corresponds to an auto refresh command, the control logic circuit 210 may apply the first refresh control signal IREF1 to the refresh control circuit 385 whenever the control logic circuit 210 receives the auto refresh command. When the command CMD from the memory controller 100 corresponds to a self-refresh entry command, the control logic circuit 210 may apply the second refresh control signal IREF2 to the refresh control circuit 385. The second refresh control signal IREF2 may be activated from a first time point when the control logic circuit 210 receives the self-refresh entry command to a second time point when the control logic circuit 210 receives a self-refresh exit command. The refresh control circuit 385 may sequentially increase or decrease the refresh row address REF_ADDR in response to receiving the first refresh control signal IREF1 or while the second refresh control signal IREF2 is activated.

The activated one of the plurality of bank row decoders 260a~260s, which may be activated by the bank control logic 230, may decode the row address RA that is output from the row address multiplexer 240, and may activate a word-line corresponding to the row address RA. For example, the activated bank row decoder 260 may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the plurality of bank column decoders 270a~270s.

The activated one of the plurality of bank column decoders 270a~270s may activate a sense amplifier 285 corresponding to the bank address BANK_ADDR and the column address COL_ADDR through the I/O gating circuit 290.

The I/O gating circuit 290 may include a circuitry for gating input/output data, and may further include input data mask logic, read data latches for storing data that is output from the plurality of bank arrays 310a~310s, and write drivers for writing data to the plurality of bank arrays 310a~310s.

A codeword CW read from one bank array of the plurality of bank arrays 310a~310s may be sensed by a sense amplifier coupled to the one bank array from which the data is to be read, and is stored in the read data latches of the I/O gating circuit 290. The codeword CW stored in the read data latches may be provided to the memory controller 100 via the data I/O buffer 295 after ECC decoding is performed on the codeword CW by the ECC circuit 400.

The main data MD to be written in one bank array of the plurality of bank arrays 310a~310s may be provided to the data I/O buffer 295 from the memory controller 100, and then provided to the ECC circuit 400 from the data I/O buffer 295. The ECC circuit 400 may perform an ECC encoding on the main data MD to generate parity data. The ECC circuit 400 may provide the main data MD and the parity data to the I/O gating circuit 290, and the I/O gating circuit 290 may write the main data MD and the parity data in a sub-page of the target page in one bank array through the write drivers of the I/O gating circuit 290.

The data I/O buffer 295 may provide the main data MD from the memory controller 100 to the ECC circuit 400 in a write operation of the semiconductor memory device 200, based on the clock signal CLK and may provide the main data MD from the ECC circuit 400 to the memory controller 100 in a read operation of the semiconductor memory device 200.

The ECC circuit 400 may perform an ECC decoding on a codeword read from a sub-page of the target page and may provide an error generation signal EGS to the control logic circuit 210 when at least one error bit is detected in the main data and/or in the codeword.

The scrubbing control circuit 500 may count the refresh row address REF_ADDR, which sequentially changes, and may output a normal scrubbing address SCADDR whenever the scrubbing control circuit 500 counts N refresh row addresses. Here, N is a natural number equal to or greater than two. The normal scrubbing address SCADDR may include a scrubbing row address SRA and a scrubbing column address SCA. The scrubbing control circuit 500 may provide the scrubbing row address SRA and the scrubbing column address SCA to the row decoder 260 and the column decoder 270.

The control logic circuit 210 may control operations of the semiconductor memory device 200. For example, the control logic circuit 210 may generate control signals for the semiconductor memory device 200 in order to perform a write operation and/or a read operation. The control logic circuit 210 may include a command decoder 211 that decodes the command CMD received from the memory controller 100 and a mode register 212 that sets an operation mode of the semiconductor memory device 200.

The control logic circuit 210 may further include a counter 214 that counts error occurrences indicated by the error generation signal EGS. The counter 214 may count the error occurrences indicated by error generation signal EGS in a scrubbing operation on the first memory cell row. The control logic circuit 210 may compare (via an included comparator) a number of error occurrences (i.e., indicated by the error generation signal EGS) with a reference value VTH and may provide the ECC circuit 400 with an error threshold flag ETF when the number of error occurrences is equal to or greater than the reference value VTH. The control logic circuit 210 may store a row address of the first memory cell row in the fault address register 580 as a row fault address RF_ADDR in response to the number of error occurrences in the first memory cell row being equal to or greater than the reference value VTH. In some embodiments, the control logic circuit 210 may halt an operation of the counter 214 when the number of error occurrences in the first memory cell row is equal to or greater than the reference value VTH.

The command decoder 211 may generate control signals corresponding to the command CMD by decoding a write enable signal, a row address strobe signal, a column address strobe signal, a chip select signal, etc. The control logic circuit 210 may generate a first control signal CTL1 to control the I/O gating circuit 290, a second control signal CTL2 to control the ECC circuit 400, and a third control signal CTL3 to control the scrubbing control circuit 500. In addition, the control logic circuit 210 may provide the refresh control circuit 385 with a mode signal MS associated with a refresh period. The control logic circuit 210 may generate the mode signal MS based on a temperature signal (not shown) representing an operating temperature of the semiconductor memory device 200.

The fuse circuit 595 may store the reference value VTH and may provide the reference value VTH to the control logic circuit 210. In some embodiments, the fuse circuit 595 may vary the reference value VTH by programming.

The address comparator 590 may compare a row address ROW_ADDR of the access address from ADDR the memory controller 100 with the row fault address RF_ADDR stored in the fault address register 580 to provide the control logic circuit with a match signal MTS based on a result of the comparison (for example, when the row address ROW_ADDR matches the row fault address). The control logic circuit 210 may control the ECC circuit 400 to skip ECC decoding on a memory cell row designated by the row address ROW_ADDR.

Figure 3:
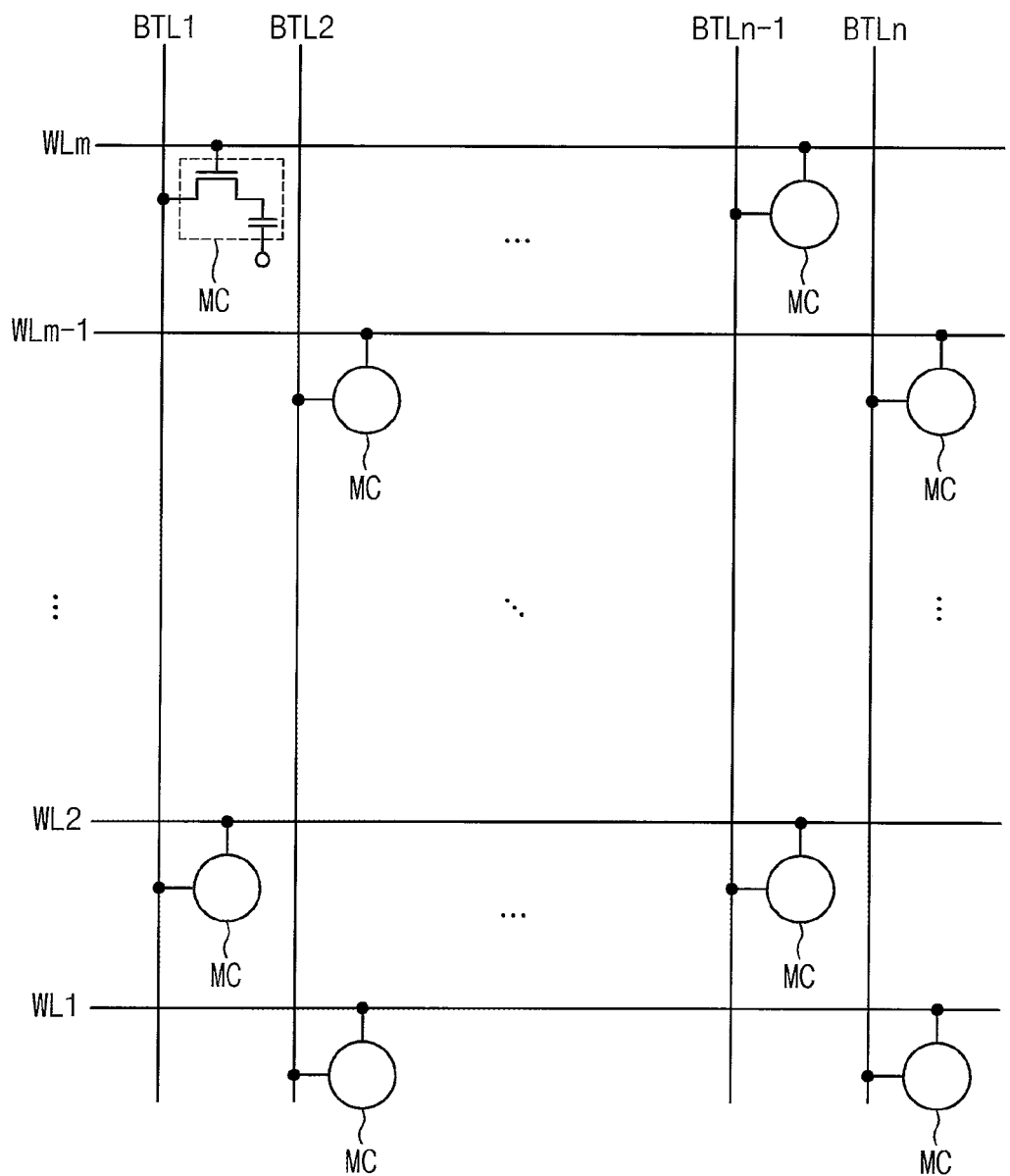
FIG. 3 illustrates an example of the first bank array in the semiconductor memory device of FIG. 2.

FIG. 3 illustrates an example of the first bank array in the semiconductor memory device of FIG. 2.

Referring to FIG. 3, the first bank array 310 may include a plurality of word-lines WL1~WLm (where m is a natural number greater than two), a plurality of bit-lines BTL1~BTLn (where n is a natural number greater than two), and a plurality of volatile memory cells MCs arranged at intersections between the word-lines WL1~WLm and the bit-lines BTL1~BTLn. Only a portion of the plurality of volatile memory cells MC of the first bank array 310 is shown in FIG. 3 to improve the clarity of the figure. Each of the memory cells MCs of the first bank array 310 may include a cell transistor coupled to one of the word-lines WL1~WLm and one of the bit-lines BTL1~BTLn, and a cell capacitor coupled to the cell transistor.

Figure 4:
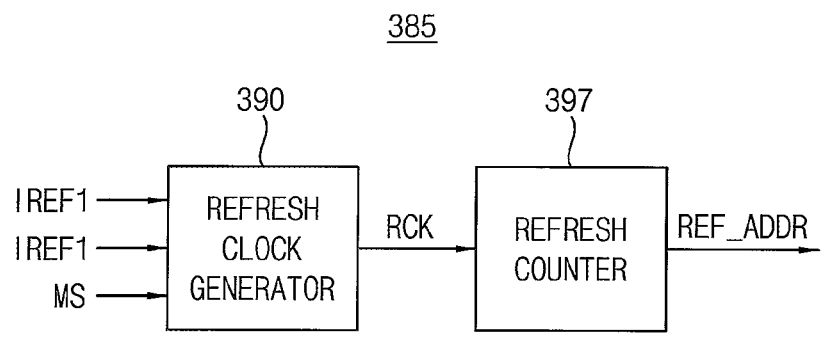
FIG. 4 is a block diagram illustrating the refresh control circuit in the semiconductor memory device of FIG. 2 according to some example embodiments.

FIG. 4 is a block diagram illustrating an example of the refresh control circuit in the semiconductor memory device of FIG. 2 according to some example embodiments.

Referring to FIG. 4, the refresh control circuit 385 may include a refresh clock generator 390 and a refresh counter 397.

The refresh clock generator 390 may generate a refresh clock signal RCK in response to the first refresh control signal IREF1, the second refresh control signal IREF2 and the mode signal MS. The mode signal MS may determine a refresh period of a refresh operation. As described above, the refresh clock generator 390 may generate the refresh clock signal RCK whenever the refresh clock generator 390 receives the first refresh control signal IREF1 or while the second refresh control signal IREF2 is activated.

The refresh counter 397 may generate the refresh row address REF_ADDR designating sequentially the memory cell rows by performing counting operation at the period of the refresh clock signal RCK.

Figure 5:
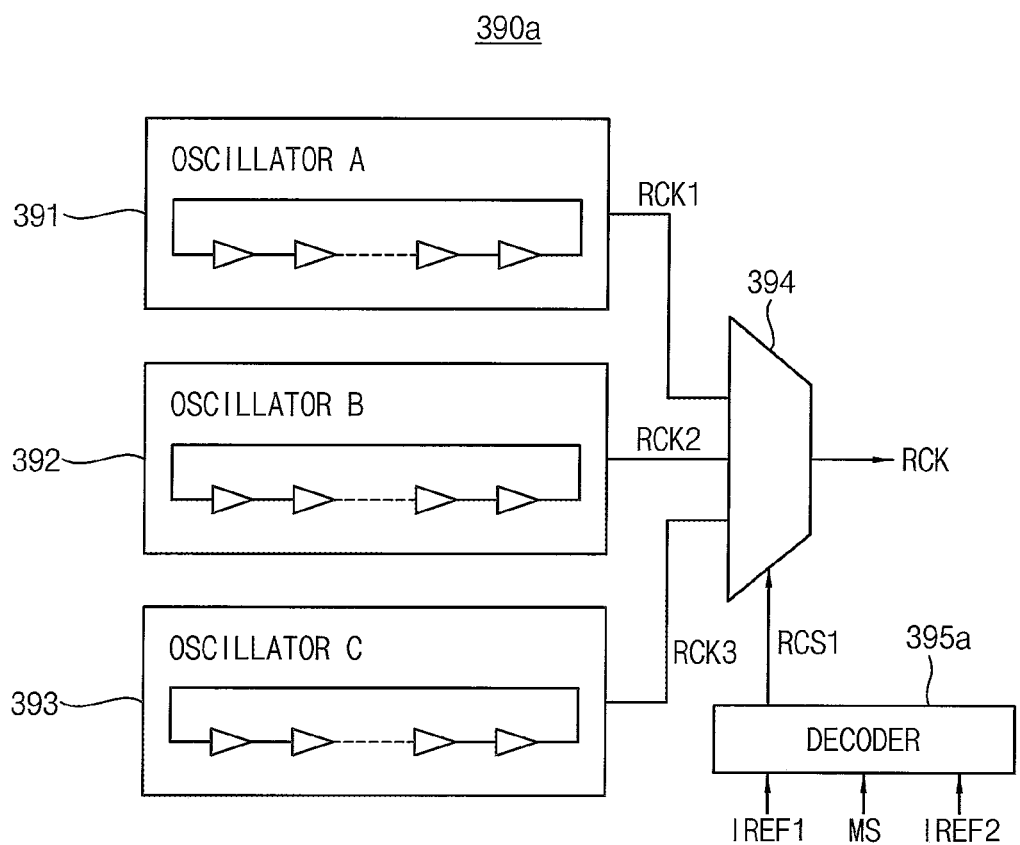
FIG. 5 is a circuit diagram illustrating an example of the refresh clock generator shown in FIG. 4 according to some example embodiments.

FIG. 5 is a circuit diagram illustrating an example of the refresh clock generator 390 shown in FIG. 4 according to some example embodiments.

Referring to FIG. 5, a refresh clock generator 390a may include a plurality of oscillators 391, 392 and 393, a multiplexer 394 and a decoder 395a. The decoder 395a may decode the first refresh control signal IREF1, the second refresh control signal IREF2 and the mode signal MS to output a clock control signal RCS1. The oscillators 391, 392, and 393 generate refresh clock signals RCK1, RCK2 and RCK3 having different periods. The multiplexer 394 is configured to select one of the refresh clock signals RCK1, RCK2 and RCK3 to provide the refresh clock signal RCK in response to the clock control signal RCS1.

Figure 6:
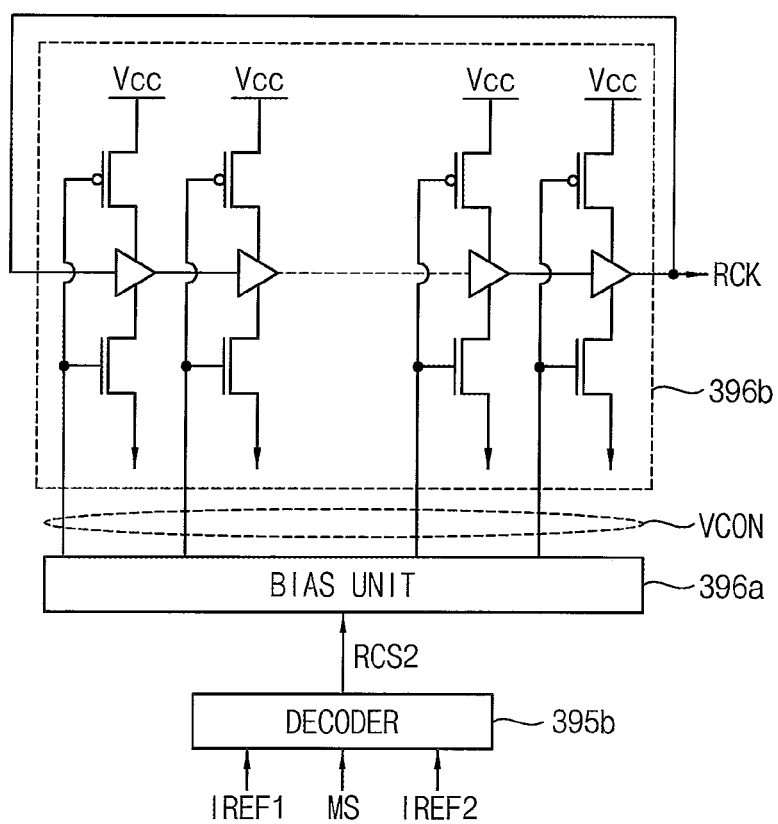
FIG. 6 is a circuit diagram illustrating another example of the refresh clock generator in FIG. 4 according to some example embodiments.

FIG. 6 is a circuit diagram illustrating another example of the refresh clock generator 390 shown in FIG. 4 according to some example embodiments.

Referring to FIG. 6, a refresh clock generator 390b may include a decoder 395b, a bias unit 396a and an oscillator 396b. The decoder 395b may decode the first refresh control signal IREF1, the second refresh control signal IREF2 and the mode signal MS, and may output a clock control signal RCS2. The bias unit 396a may generate a control voltage VCON in response to the clock control signal RCS2. The oscillator 396b may generate the refresh pulse signal RCK having a variable period, according to the control voltage VCON.

Figure 7:
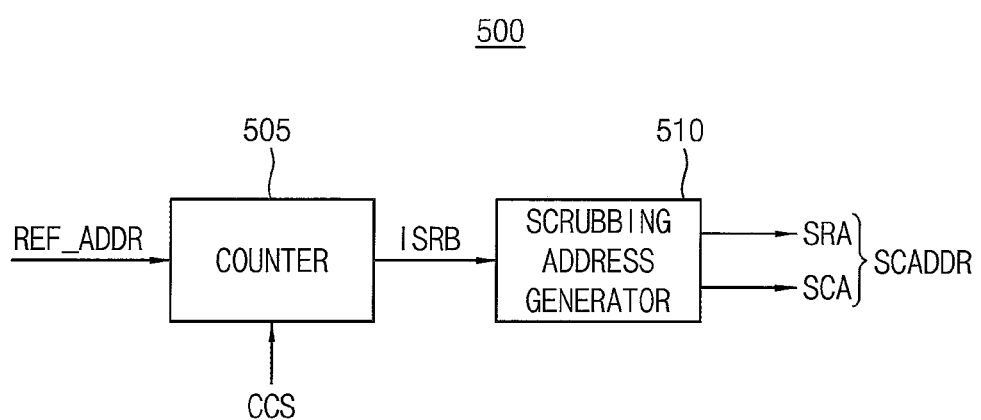
FIG. 7 is a block illustrating an example of the scrubbing control circuit in the semiconductor memory device of FIG. 2 according to some example embodiments.

FIG. 7 is a block illustrating an example of the scrubbing control circuit in the semiconductor memory device of FIG. 2 according to some example embodiments.

Referring to FIG. 7, the scrubbing control circuit 500 may include a counter 505 and a scrubbing address generator 510.

The counter 505 may count the refresh row address REF_ADDR and may generate an internal scrubbing signal ISRB. The internal scrubbing signal ISRB may be activated during a first interval when the counter 505 counts the refresh row address REF_ADDR by a number designated by a counting control signal CCS. The first interval may correspond to a time interval for refreshing one memory cell row.

The scrubbing address generator 510 may generate a normal scrubbing address SCADDR associated with a normal scrubbing operation for codewords in each of the memory cell rows, which may gradually change in the first scrubbing mode, in response to the internal scrubbing signal ISRB.

The normal scrubbing address SCADDR may include a scrubbing row address SRA and a scrubbing column address SCA. The scrubbing row address SRA may designate one page in one bank array and the scrubbing column address SCA may designate one of the codewords in the one page. The scrubbing address generator 510 may provide the scrubbing row address SRA to a corresponding row decoder and the scrubbing column address SCA to a corresponding column decoder.

The scrubbing operation that is performed based on the normal scrubbing address SCADDR may be referred to as a normal scrubbing operation, because the scrubbing operation performed based on the normal scrubbing address SCADDR may be performed on all codewords included in the memory cell array 300.

Figure 8:
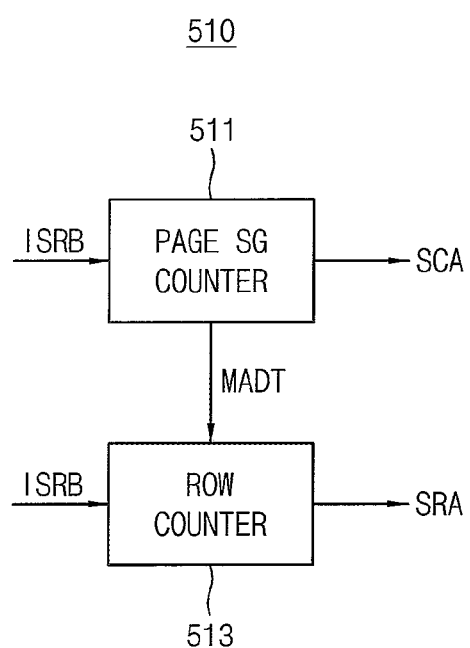
FIG. 8 is a block diagram illustrating the scrubbing address generator in the scrubbing control circuit of FIG. 7 according to some example embodiments.

FIG. 8 is a block diagram illustrating the scrubbing address generator in the scrubbing control circuit of FIG. 7 according to some example embodiments.

Referring to FIG. 8, the scrubbing address generator 510 may include a page segment counter 511 and a row counter 513.

The page segment counter 511 may increase the scrubbing column address SCA by one while the internal scrubbing signal ISRB is activated, and may activate a maximum address detection signal MADT (and reset the scrubbing column address SCA) whenever the scrubbing column address SCA reaches its maximum value, in response to the internal scrubbing signal ISRB. The page segment counter 511 may provide the maximum address detection signal MADT to the row counter 513.

In response to the internal scrubbing signal ISRB, the row counter 513 may start counting operation on receiving the internal scrubbing signal ISRB initially, and may increase the scrubbing row address SRA by one whenever the activated maximum address detection signal MADT is received from the page segment counter 511. Since the internal scrubbing signal ISRB may be activated during a first interval while a refresh operation is performed on one memory cell row, the page segment counter 511 may generate the scrubbing column address SCA associated with codewords in one page during the first interval.

Figure 9:
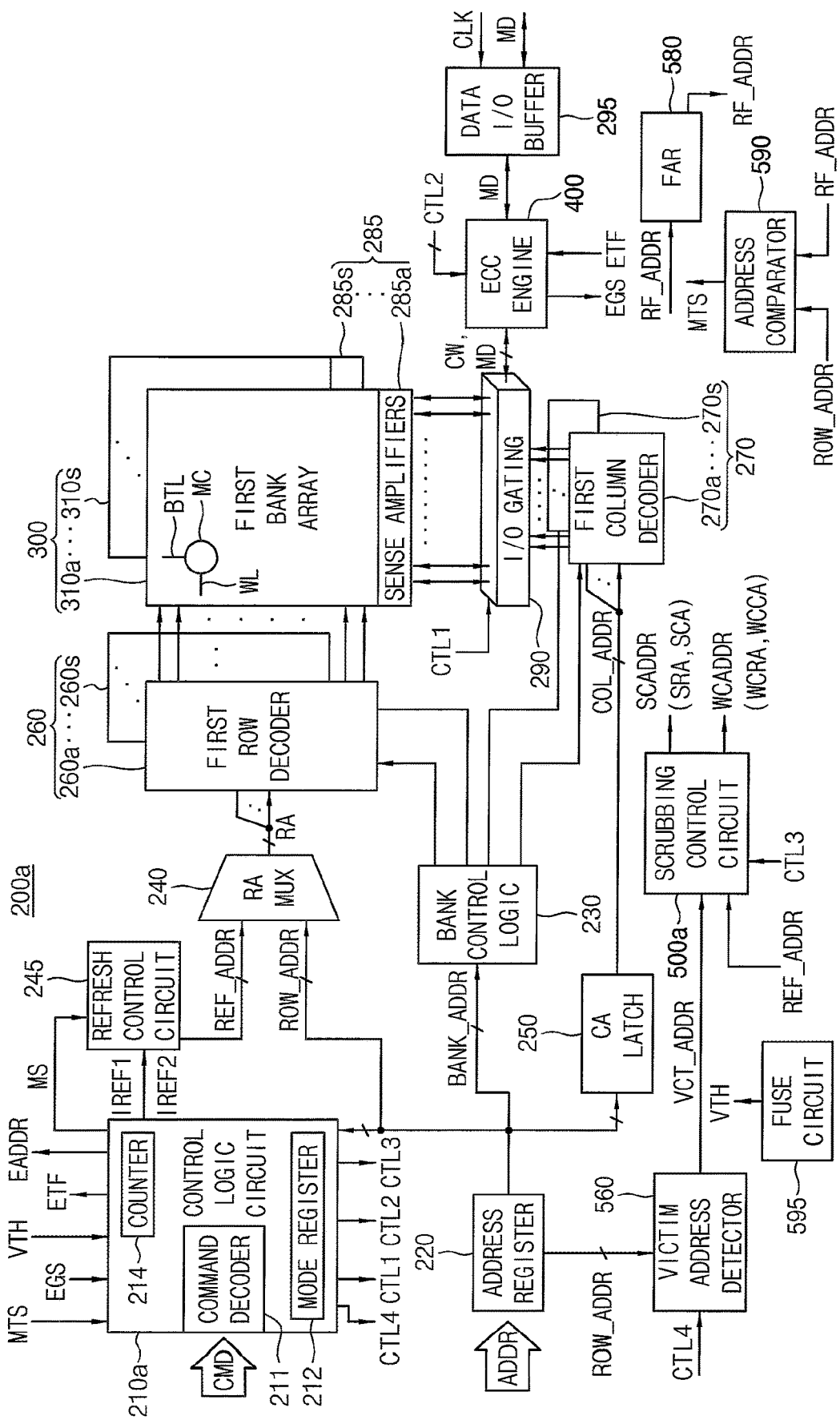
FIG. 9 is a block diagram illustrating another example of the semiconductor memory device in FIG. 1 according to some example embodiments.

FIG. 9 is a block diagram illustrating another example of the semiconductor memory device in FIG. 1 according to some example embodiments.

A semiconductor memory device 200a of FIG. 9 differs from the semiconductor memory device 200 of FIG. 2 in that the semiconductor memory device 200a further includes a victim address detector 560 and a scrubbing control circuit 500a that outputs a weak codeword address WCADDR in a second scrubbing mode.

Referring to FIG. 9, a control logic circuit 210a may further generate a fourth control signal CTL4 for controlling the victim address detector 560.

The victim address detector 560 may count a number of accesses to a first memory region in the memory cell array 300, and may generate at least one victim address VCT_ADDR that designates at least one adjacent memory region adjacent to the first memory region when the number of the counted accesses reaches the reference number of times during a reference interval. The victim address VCT_ADDR may be stored in an address storing table of the scrubbing control circuit 500a.

In a first scrubbing mode, the scrubbing control circuit 500a may provide a scrubbing row address SRA and a scrubbing column address SCA to the row decoder 260 and the column decoder 270, respectively. In a second scrubbing mode, the scrubbing control circuit 500a may output an address of a codeword associated with the victim address VCT_ADDR that is stored in the address storing table as the weak codeword address WCADDR. The weak codeword address WCADDR may include a weak codeword row address WCRA and a weak codeword column address WCCA. The scrubbing control circuit 500a may provide the weak codeword row address WCRA and the weak codeword column address WCCA to the row decoder 260 and the column decoder 270, respectively.

Figure 10:
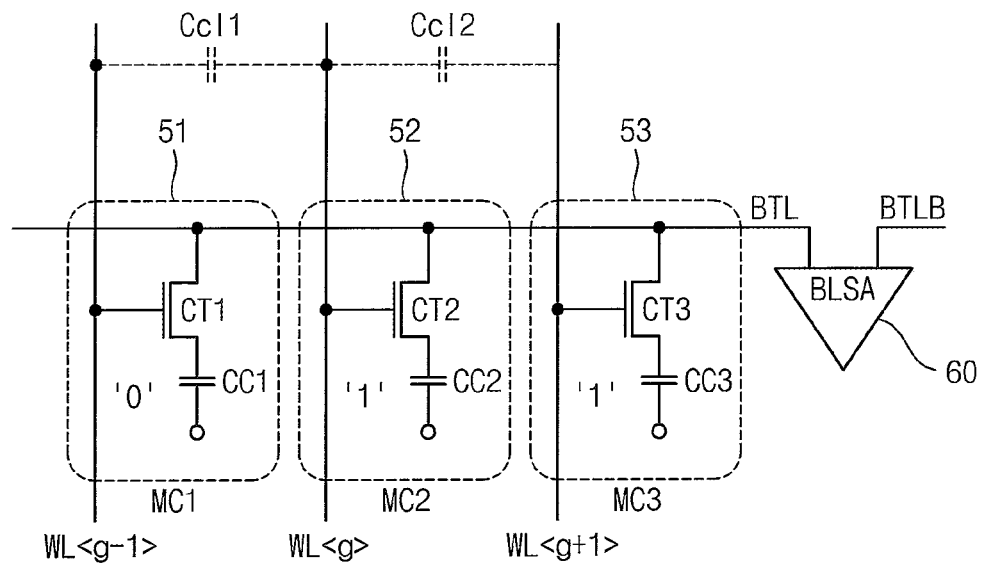
FIG. 10 is a circuit diagram illustrating disturbance between memory cells of a semiconductor memory device.

FIG. 10 is a circuit diagram illustrating a disturbance between memory cells of a semiconductor memory device.

Referring to FIG. 10, a part of the semiconductor memory device 200a includes memory cells 51, 52, and 53 and a bit-line sense amplifier 60.

It is assumed that each of the memory cells 51, 52, and 53 is connected to the same bit-line BTL. In addition, the memory cell 51 is connected to a word-line WL<g−1>, the memory cell 52 is connected to a word-line WL<g>, and the memory cell 53 is connected to a word-line WL<g+1>. As shown in FIG. 10, the word-lines WL<g−1> and WL<g+1> are located adjacent to the word-line WL<g>. The memory cell 51 includes an access transistor CT1 and a cell capacitor CC1. A gate terminal of the access transistor CT1 is connected to the word-line WL<g−1>, and the access transistor CT1 is connected between the bit-line BTL and the cell capacitor CC1. The memory cell 52 includes an access transistor CT2 and a cell capacitor CC2. A gate terminal of the access transistor CT2 is connected to the word-line WL<g>, and the access transistor CT2 is connected between to the bit-line BTL and the cell capacitor CC2. Also, the memory cell 53 includes an access transistor CT3 and a cell capacitor CC3. A gate terminal of the access transistor ST3 is connected to the word-line WL<g+1>, and the access transistor CT3 is connected between the bit-line BTL and the cell capacitor CC3.

The bit-line sense amplifier 60 may include an N sense amplifier discharging a low level bit line among bit lines BTL and BTLB and a P sense amplifier charging a high level bit line among the bit lines BTL and BTLB.

During a refresh operation, the bit-line sense amplifier 60 may rewrite through the N sense amplifier or the P sense amplifier data that is stored in a selected memory cell. During a read operation or a write operation, a select voltage (for example, Vpp) may be provided to the word-line WL<g>. However, due to capacitive coupling effect, a voltage of adjacent word-lines WL<g−1> and WL<g+1> may rise even when no select voltage is applied. Such capacitive coupling is indicated with parasitic capacitances Ccl1 and Ccl2.

Between refresh operations, if the word-line WL<g> is accessed repeatedly, charges stored in the cell capacitors CC1 and CC3 of the memory cells 51 and 53 connected to the word-lines WL<g−1> and WL<g+1> may leak gradually. In this case, the reliability of a logic '0' stored in the cell capacitor CC1 and a logic '1' stored in the cell capacitor CC3 may not be reduced. Therefore, the scrubbing operation on the memory cells is needed at an appropriate time.

Figure 11:
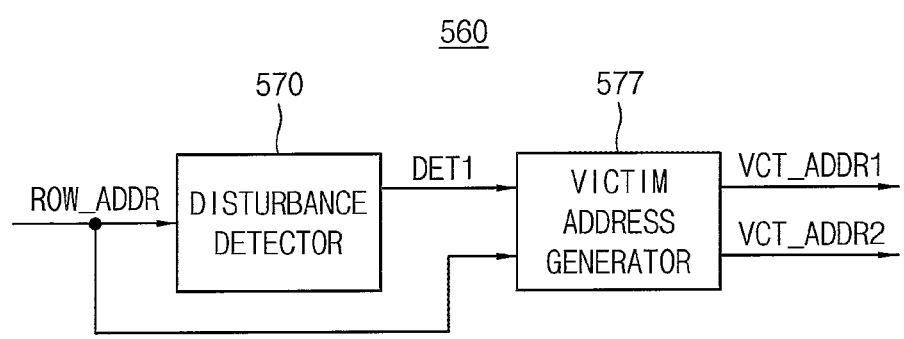
FIG. 11 is a block diagram illustrating an example of the victim address detector in the semiconductor memory device of FIG. 9 according to some example embodiments.

FIG. 11 is a block diagram illustrating an example of the victim address detector in the semiconductor memory device of FIG. 9 according to some example embodiments.

Referring to FIG. 11, the victim address detector 560 may include a disturbance detector 570 and a victim address generator 577.

The disturbance detector 570 may count a number of accesses to a first memory region (i.e., at least one memory cell row) based on the row address ROW_ADDR and may generate a first detection signal DET1 when the number of the counted accesses reaches a reference value during a reference (or predetermined) interval.

The victim address generator 577 may generate the at least one victim address VCT_ADDR1 and VCT_ADDR2 in response to the first detection signal DET1. For example, the at least one victim address VCT_ADDR1 and VCT_ADDR2 may each be a row address designating a second memory region and a third memory region which are located adjacent to the first memory region. The victim address generator 577 may provide the at least one victim address VCT_ADDR1 and VCT_ADDR2 to an address storing table in the scrubbing control circuit 500a.

Figure 12:
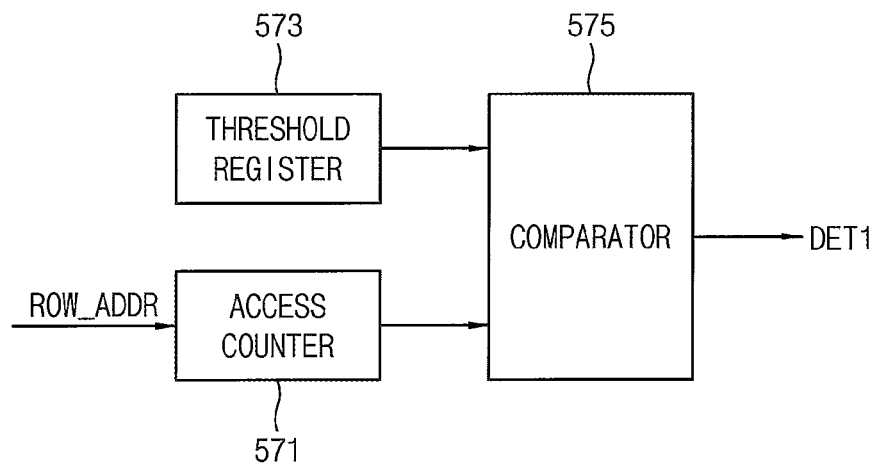
FIG. 12 is a block diagram illustrating the disturbance detector in the victim address detector of FIG. 11.

FIG. 12 is a block diagram illustrating the disturbance detector in the victim address detector of FIG. 11.

Referring to FIG. 12, the disturbance detector 570 may include an access counter 571, a threshold register 573 and a comparator 575.

The access counter 571 may count a number of accesses to a specified address (or a specified memory region) based on the row address ROW_ADDR. For example, the access counter 571 may count a number of accesses to a specified word-line. The number of accesses may be counted on a specific word-line or a word-line group including at least two word-lines. Moreover, a count of the number of accesses may be performed by a specific block unit, a bank unit, or a chip unit.

The threshold register 573 may store a maximum disturbance occurrence count that may be selected to provide an desired assurance level as to the reliability of data in a specific word-line or a memory unit. For example, a threshold value (or a reference value) on one word-line may be stored in the threshold register 573. Alternatively, a threshold value on one word line group, one block, one bank unit, or one chip unit may be stored in the threshold register 573.

The comparator 575 may compare the threshold value stored in the threshold register 573 with the number of accesses to a specific memory region counted by the access counter 571. If there is a memory region where the counted number of accesses reaches the threshold value, the comparator 575 may generate the first detection signal DET1. The comparator 575 may provide the first detection signal DET1 to the victim address generator 577.

Figure 13:
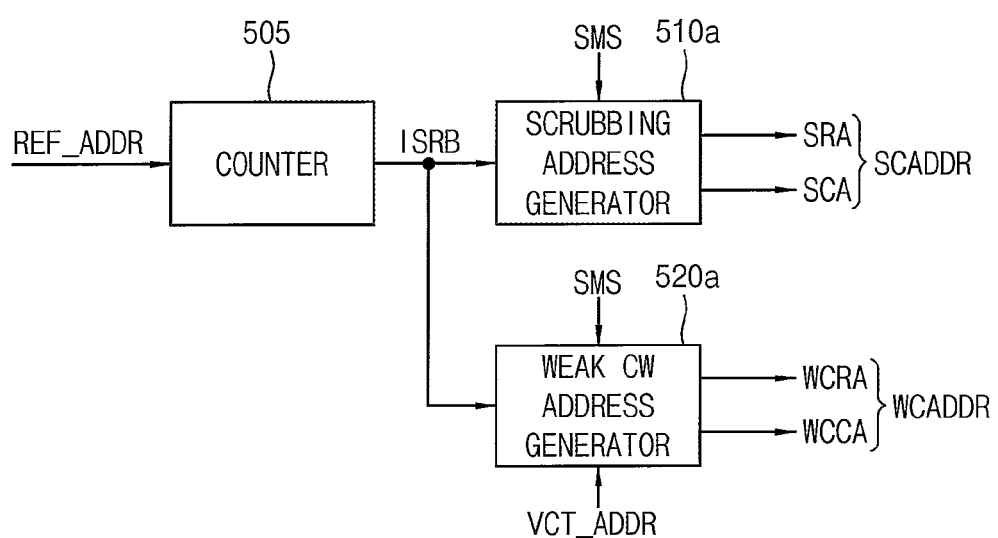
FIG. 13 is a block diagram illustrating an example of the scrubbing control circuit in the semiconductor memory device of FIG. 9 according to some example embodiments.

FIG. 13 is a block diagram illustrating an example of the scrubbing control circuit in the semiconductor memory device of FIG. 9 according to some example embodiments.

Referring to FIG. 13, the scrubbing control circuit 500a may include a counter 505, a scrubbing address generator 510a and a weak codeword address generator 520a.

Some operations of the counter 505, and the scrubbing address generator 510a are substantially similar with operations of the counter 505 and the scrubbing address generator 510 in FIG. 7. The scrubbing address generator 510a of FIG. 13 may further receive the scrubbing mode signal SMS and generate the normal scrubbing address SCADDR in the first scrubbing mode.

The weak codeword address generator 520a may generate a weak codeword address WCADDR associated with a weak scrubbing operation associated with weak codewords in the bank array in the second scrubbing mode, in response to the internal scrubbing signal ISRB and the scrubbing mode signal SMS. The weak codeword address WCADDR may include a weak codeword row address WCRA and a weak codeword column address WCCA.

The scrubbing mode signal SMS may indicate the first scrubbing mode when the scrubbing mode signal SMS has a first logic level and indicates the second scrubbing mode when the scrubbing mode signal SMS has a second logic level. The scrubbing mode signal SMS may be included in the third control signal CTL3. The weak codeword address generator 520a may provide the weak codeword row address WCRA to the corresponding row decoder and the weak codeword column address SCA to the corresponding column decoder.

The weak codeword address generator 520a may include an address storing table therein, which may store addresses of codewords associated with the victim address VCT_ADDR. The scrubbing operation performed based on the weak codeword address WCADDR may be referred to as a target scrubbing operation because the scrubbing operation is performed on the weak codewords.

Figure 14:
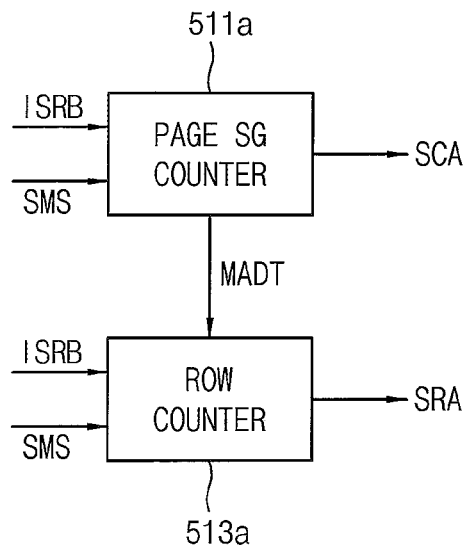
FIG. 14 is a block diagram illustrating the scrubbing address generator in the scrubbing control circuit of FIG. 13 according to some example embodiments.

FIG. 14 is a block diagram illustrating the scrubbing address generator 510a in the scrubbing control circuit of FIG. 13 according to some example embodiments.

Referring to FIG. 14, the scrubbing address generator 510a may include a page segment counter 511a and a row counter 513a.

The page segment counter 511a may increase the scrubbing column address SCA by one during the internal scrubbing signal ISRB is activated in the first scrubbing mode, and may activate a maximum address detection signal MADT whenever the scrubbing column address SCA reaches its maximum value (and reset the scrubbing column address SCA), in response to the internal scrubbing signal ISRB and the scrubbing mode signal SMS. The page segment counter 511a may provide the maximum address detection signal MADT to the row counter 513a.

In response to the internal scrubbing signal ISRB and the scrubbing mode signal SMS, the row counter 513a may start a counting operation upon receiving the internal scrubbing signal ISRB initially, and may increase the scrubbing row address SRA by one whenever the activated maximum address detection signal MADT is received from the page segment counter 511a.

Figure 15:
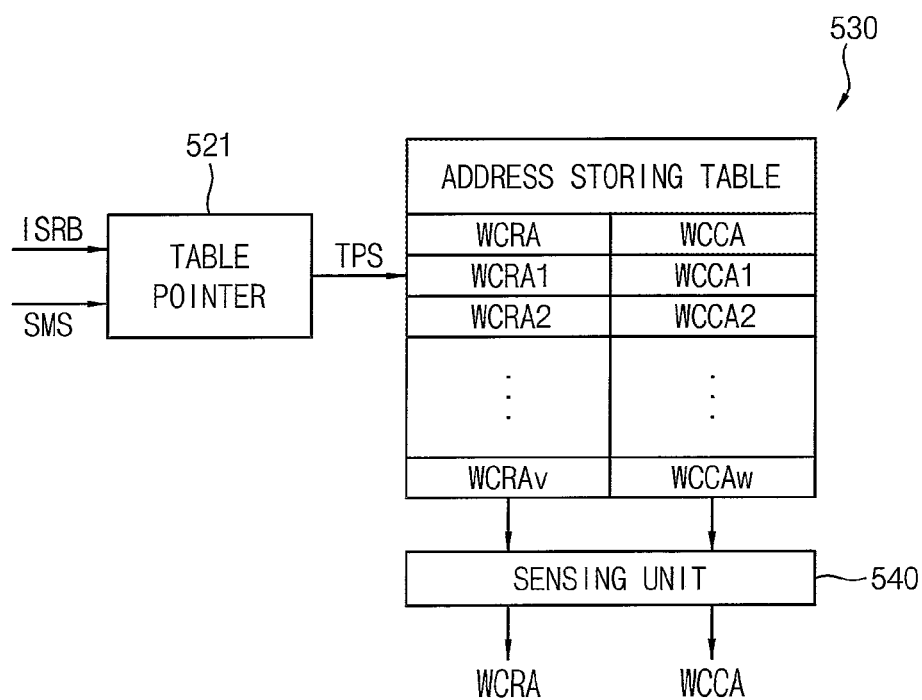
FIG. 15 illustrates the weak codeword address generator in the scrubbing control circuit of FIG. 13 according to some example embodiments.

FIG. 15 illustrates the weak codeword address generator 520a in the scrubbing control circuit of FIG. 13 according to some example embodiments.

Referring to FIG. 15, the weak codeword address generator 520a may include a table pointer 521, an address storing table 530 and a sensing unit 540.

The address storing table 530 may store address information WCRA1~WCRAs and WCCA1~WCCAt (where t is a positive integer greater than s) of weak codewords included in the memory cell array 300.

The weak codewords may be all or some of a weak page that includes a number of error bits greater than a reference value among pages in bank arrays of the memory cell array. In addition, the weak codewords may be codewords of neighbor pages adjacent to an intensively accessed memory region.

The table pointer 521 may generate a pointer signal TPS which may provide location information for the address storing table 530 in response to the internal scrubbing signal ISRB and the scrubbing mode signal SMS during the first interval in the second scrubbing mode, and may provide the pointer signal TPS to the address storing table 530. The address storing table 530 may include a nonvolatile storage. The at least one victim address VCT_ADDR1 and VCT_ADDR2 provided from the victim address generator 577 in FIG. 11 may be stored in the address storing table 530.

The pointer signal TPS may gradually increase by a predetermined amount during the first interval, and the address storing table 530 may output a weak codeword address stored in a location (indicated by the pointer signal TPS) as the weak codeword row address WCRA and the weak codeword column address WCCA through the sensing unit 540 in response to the pointer signal TPS whenever the pointer signal TPS is applied. The sensing unit 540 may provide the weak codeword row address WCRA to a corresponding row decoder and the weak codeword column address WCCA to a corresponding column decoder.

The control logic circuit 210a may apply different refresh periods to some memory cell rows based on a number of error bits for each of the memory cell rows, which are detected by the scrubbing operation.

Figure 16:
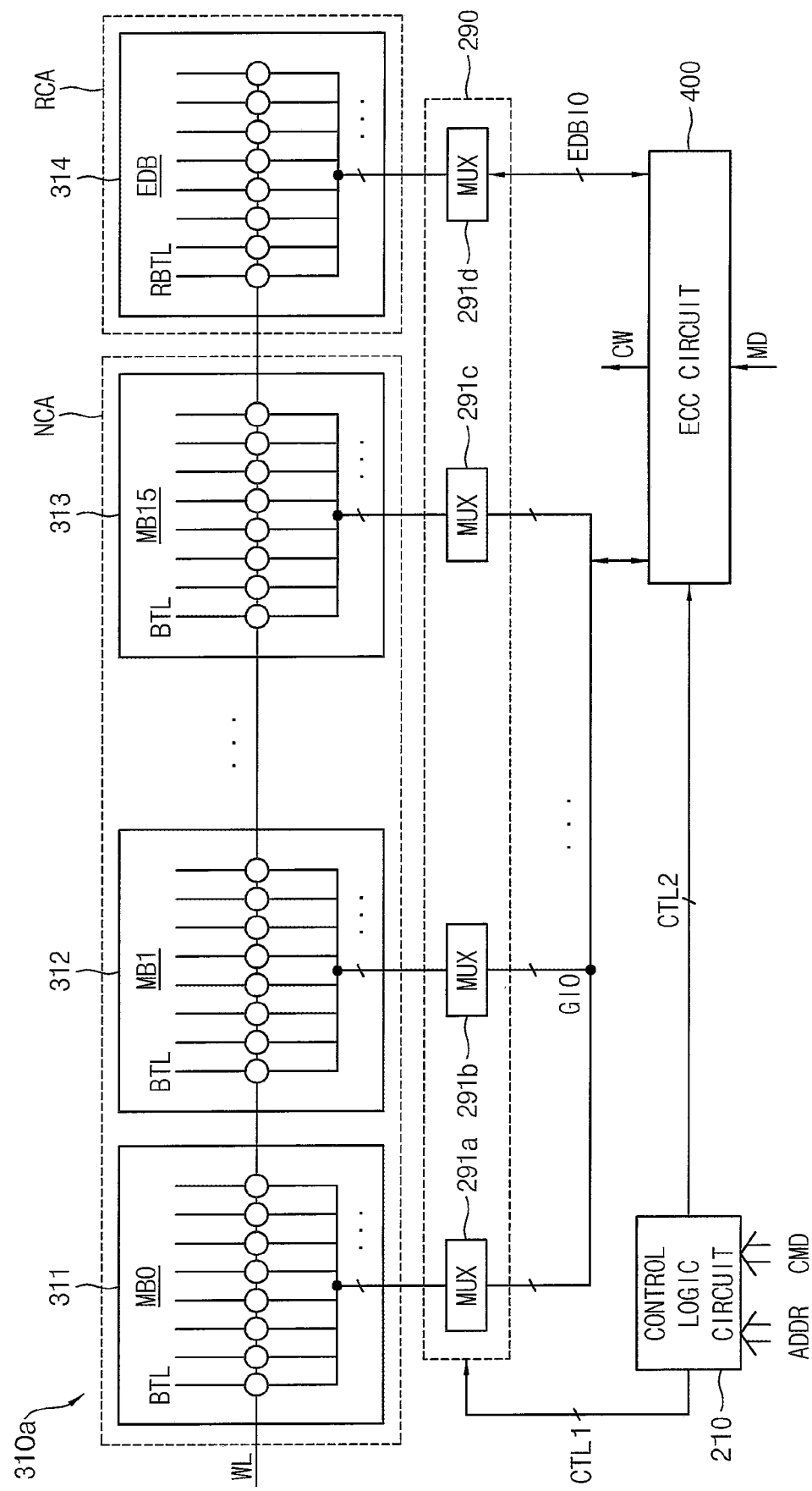
FIG. 16 illustrates a portion of the semiconductor memory device of FIG. 2 in a write operation.

FIG. 16 illustrates a portion of the semiconductor memory device of FIG. 2 in a write operation.

In FIG. 16, the control logic circuit 210, the first bank array 310a, the I/O gating circuit 290, and the ECC circuit 400 are illustrated.

Referring to FIG. 16, the first bank array 310a may include a normal cell array NCA and a redundancy cell array RCA. The normal cell array NCA may include a plurality of first memory blocks MB0~MB15, i.e., 311~313, and the redundancy cell array RCA may include at least a second memory block 314. The first memory blocks 311~313 may be memory blocks that are used in determining a memory capacity of the semiconductor memory device 200. The second memory block 314 is for ECC and/or redundancy repair. Since the second memory block 314 is used for ECC, redundancy repair, data line repair and/or block repair to repair 'fail' cells generated in the first memory blocks 311~313, the second memory block 314 may be also referred to as an EDB block. In each of the first memory blocks 311~313, a plurality of first memory cells may be arranged in rows and columns. In the second memory block 314, a plurality of second memory cells may be arranged in rows and columns. The first memory cells connected to intersections of the word-lines WL and the bit-lines BTL may be dynamic memory cells. The second memory cells connected to intersections of the word-lines WL and bit-lines RBTL may be dynamic memory cells.

The I/O gating circuit 290 may include a plurality of switching circuits 291a~291d respectively connected to the first memory blocks 311~313 and the second memory block 314. In the semiconductor memory device 200, bit-lines corresponding to data of a burst length (BL) may be simultaneously accessed to support the BL indicating the maximum number of column positions that is accessible. For example, the BL may be set to 8.

The ECC circuit 400 may be connected to the switching circuits 291a~291d through first data lines GIO and second data lines EDBIO. The control logic circuit 210 may receive the command CMD and the address ADDR and may decode the command CMD to generate the first control signal CTL1 for controlling the switching circuits 291a~291d and the second control signal CTL2 for controlling the ECC circuit 400.

When the command CMD is a write command, the control logic circuit 210 may provide the second control signal CTL2 to the ECC circuit 400 and the ECC circuit 400 may perform the ECC encoding on the main data MD to generate parity bits associated with the main data MD and provides the I/O gating circuit 290 with the codeword CW including the main data MD and the parity bits. The control logic circuit 210 may provide the first control signal CTL1 to the I/O gating circuit 290 such that the codeword CW is to be stored in a sub-page of the target page in the first bank array 310.

Figure 17:
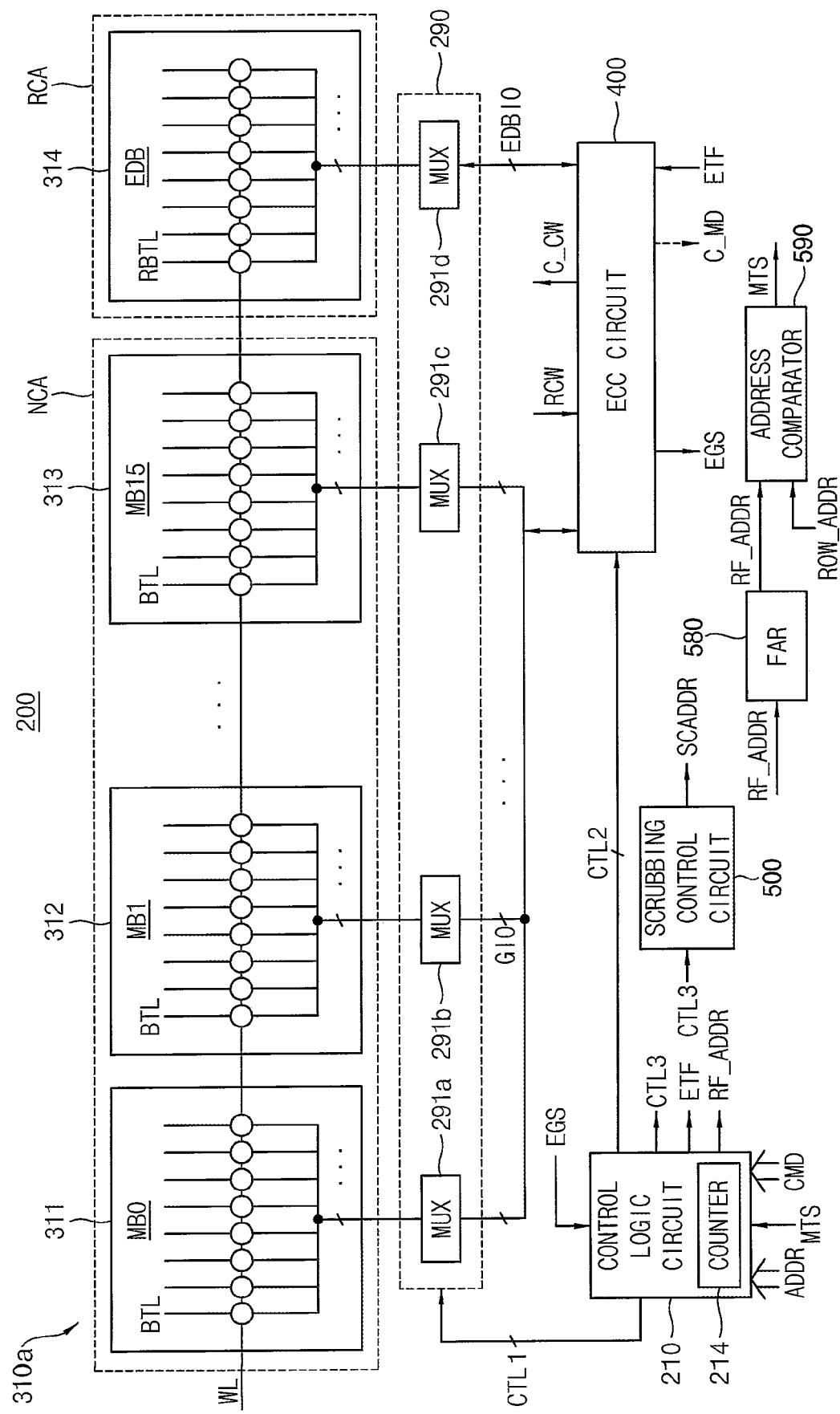
FIG. 17 illustrates a portion of the semiconductor memory device of FIG. 2 in a refresh operation or a read operation.

FIG. 17 illustrates a portion of the semiconductor memory device of FIG. 2 in a refresh operation (scrubbing operation) or a read operation.

In FIG. 17, the control logic circuit 210, the first bank array 310a, the I/O gating circuit 290, the ECC circuit 400, the fault address register 580 and the address comparator 590 are illustrated.

Referring to FIG. 17, when the command CMD is a refresh command to designate a refresh operation, the scrubbing control circuit 500 may generate the scrubbing addresses based on counting refresh row addresses, and the control logic circuit 210 may provide the first control signal CTL1 to the I/O gating circuit 290 such that a read codeword RCW stored in each of sub-pages of the target page in the first bank array 310 is sequentially provided to the ECC circuit 400.

The ECC circuit 400 may perform an error detection operation on each read codeword RCW and provide the error generation signal EGS to the control logic circuit 210 in response to detecting an error bit during a first period of the scrubbing operation. The control logic circuit 210 may count the number of error occurrences indicated by the error generation signal EGS for one page and may determine whether a row fault occurs in the target page based on comparison of the number of error occurrences with the reference value VTH. When the number of error occurrences is equal to or greater than the reference value VTH, the control logic circuit 210 may provide the ECC circuit 400 with the error threshold flag ETH having a high level and may store a row address of the target page in the fault address register 580.

The control logic circuit 210 may determine whether to correct a codeword in which the error is detected based on comparison of the number of error occurrences with the reference value VTH, and may write back the codeword in which the error is selectively corrected during a second interval of the scrubbing operation.

When the command CMD corresponds to a read command, the ECC circuit 400 may provide a corrected main data C_MD to the data I/O buffer 295 with skipping of writing back the codeword in which the error is detected.

When the command CMD corresponds to a read command after the row fault address RF_ADDR is stored in the fault address register 580, the address comparator 590 may compare the row address ROW_ADDR with the row fault address RF_ADDR and may provide the control logic circuit 210 with the match signal MTS indicating a result of the comparison. When the match signal MTS indicates that the row address ROW_ADDR matches the row fault address RF_ADDR, the control logic circuit 210 may control the ECC circuit 400 to skip an ECC decoding on a memory cell row designated by the row address ROW_ADDR.

Figure 18:
FIG. 18 illustrates an example of the fault address register in the semiconductor memory device of FIG. 2 according to some example embodiments.

FIG. 18 illustrates the fault address register in the semiconductor memory device of FIG. 2 according to some example embodiments.

Referring to FIG. 18, each of a plurality of indexes (e.g., entries) Idx11, Indx12, . . . , Idx1$u$ (where u is a natural number greater than two) of the fault address register 580 may include information on a respective row fault address RF_ADDR. Each row fault address RF_ADDR may refer to a row fault memory cell row which was found to have a row fault during a first interval of the scrubbing operation. The fault address register 580 includes a plurality of columns 581 and 583.

The column 581 may store a row fault address RF_ADDR of each of the row fault memory cell rows and the column 583 may store a number of error occurrences ECNT of each of the row fault memory cell rows. The row fault address RF_ADDR may include a bank group address ('BGA'), a bank address ('BA'), and a row address ('RA') of each of the row fault memory cell rows.

In FIG. 18, it is assumed that a memory cell row is found to have a row fault when the number of error occurrences ECNT detected during the first interval is equal to or greater than three, but the present disclosure is not limited thereto.

The control logic circuit 210 in FIG. 2 may perform a soft post package repair (PPR) on at least some of the row fault memory cell rows by referring to the fault address register 580. The control logic circuit 210 may perform a soft PPR on the at least some of the row fault memory cell rows by storing (moving) data stored in the at least some of the row fault memory cell rows in a redundancy region of the memory cell array 300. The row fault address RF_ADDR of the at least some of the row fault memory cell rows on which the soft PPR is performed may be reset in the fault address register 580 (e.g., may be removed from the fault address register 580) and a row fault address of a new row fault memory cell row may be stored in the fault address register 580.

Figure 19:
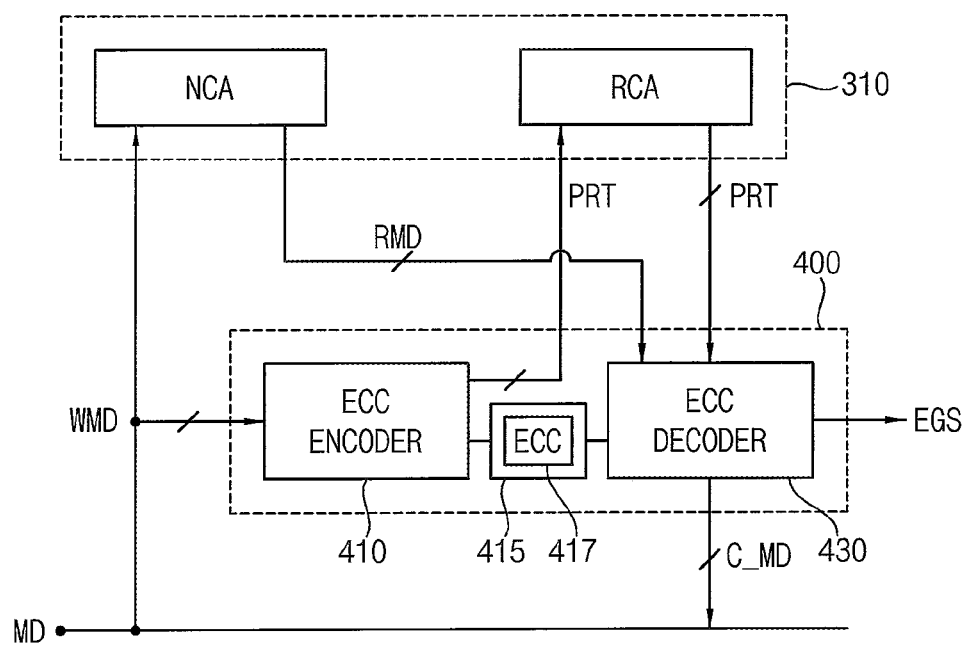
FIG. 19 is a block diagram illustrating an example of the ECC circuit in the semiconductor memory device of FIG. 2 according to some example embodiments.

FIG. 19 is a block diagram illustrating an example of the ECC circuit in the semiconductor memory device of FIG. 2 according to some example embodiments.

Referring to FIG. 19, the ECC circuit 400 may include an ECC encoder 410, an ECC decoder 430 and a (ECC) memory 415. The memory 415 may store an ECC 417. The ECC 417 may be a single error correction (SEC) code. or may be a single error correction/double error detection (SECDED) code.

Using the ECC 417, the ECC encoder 410 may generate parity data PRT associated with a write data WMD to be stored in the normal cell array NCA of the first bank array 310. The parity data PRT may be stored in the redundancy cell array RCA of the first bank array 310.

The ECC decoder 430 may perform an ECC decoding on a read data RMD based on a read data RMD and a parity data PRT read respectively from the normal cell array NCA and redundant cell array RCA of the first bank array 310 using the ECC 417. When the read data RMD includes at least one error bit as a result of the ECC decoding, the ECC decoder 430 may provide the error generation signal EGS to the control logic circuit 210, selectively correct the error bit in the read data RMD, and write back the read data RMD in a scrubbing operation, and may output the corrected main data C_MD in a read operation.

Figure 20:
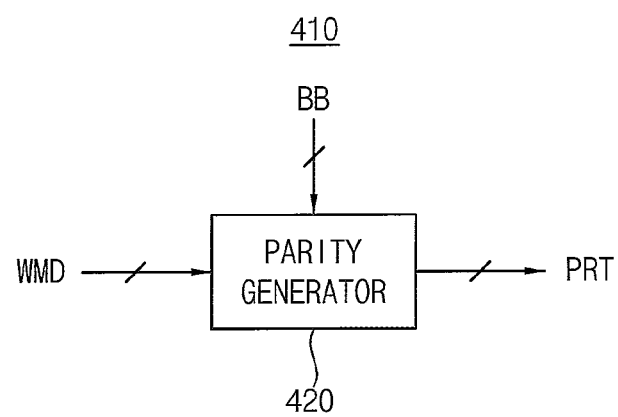
FIG. 20 illustrates an example of the ECC encoder in the ECC circuit of FIG. 19 according to some example embodiments.

FIG. 20 illustrates an example of the ECC encoder in the ECC circuit of FIG. 19 according to some example embodiments.

Referring to FIG. 20, the ECC encoder 410 may include a parity generator 420. The parity generator 420 may receive write data WMD and basis bit BB and may generate the parity data PRT by performing, for example, an XOR array operation.

Figure 21:
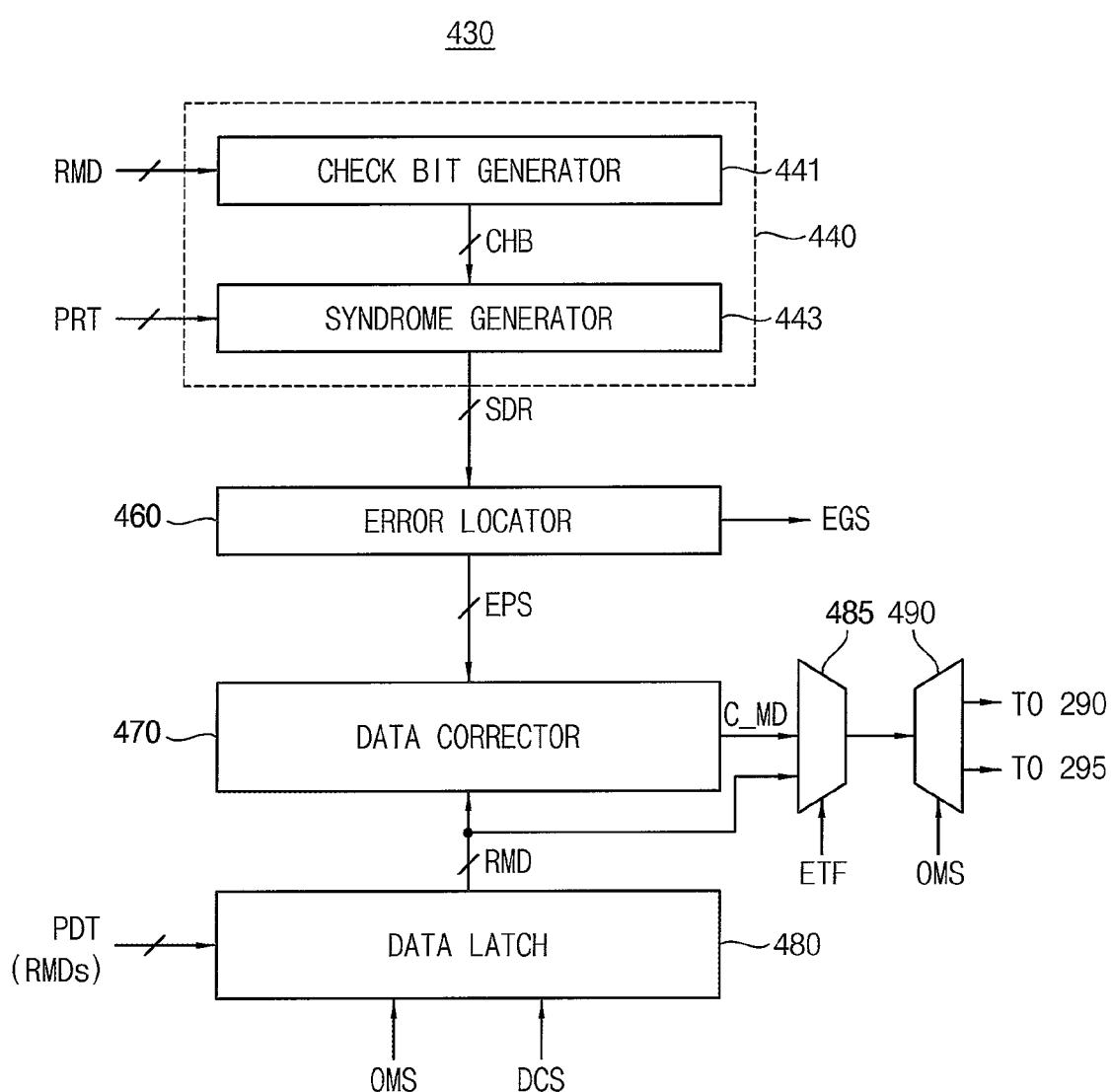
FIG. 21 illustrates an example of the ECC decoder in the ECC circuit of FIG. 19 according to some example embodiments.

FIG. 21 illustrates an example of the ECC decoder in the ECC circuit of FIG. 19 according to some example embodiments.

Referring to FIG. 21, the ECC decoder 430 may include a syndrome generation circuit 440, an error locator 460, a data corrector 470 a data latch 480, a multiplexer 485 and a demultiplexer 490. The syndrome generation circuit 440 may include a check bit generator 441 and a syndrome generator 443.

The check bit generator 441 may generate check bits CHB based on the read data RMD by performing, an XOR array operation. The syndrome generator 443 may generate a syndrome SDR by comparing corresponding bits of the parity data PRT and the check bits CHB.

The error locator 460 may generate an error position signal EPS indicating a position of an error bit in the read data RMD, and may provide the error position signal EPS to the data corrector 470 when all bits of the syndrome SDR are not 'zero'. In addition, when the read data RMD includes an error bit, the error locator 460 may provide the error generation signal EGS to the control logic circuit 210.

The data latch 480, in a scrubbing operation, may receive page data PDT including a plurality of read data RMDs, and in response to an operation mode signal OMS and a data control signal DCS, may provide the data corrector 470 with the read data RMD including a correctable error bit in a scrubbing operation or provide the data corrector 470 with the read data RMD without regard to an error bit in a read operation. The operation mode signal OMS may designate one of the scrubbing operation and the read operation. The operation mode signal OMS and the control signal DCS may be included in the second control signal CTL2 in FIG. 2.

The data corrector 470 may receive the read data RMD, may correct the error bit in the read data RMD based on the error position signal EPS when the read data RMD includes the error bit, and may output the corrected main data C_MD.

The multiplexer 485 may select one of the read data RMD or the corrected main data C_MD in response to the error threshold flag ETF, and may provide the selected one to the demultiplexer 490. When the error threshold flag ETF indicates that the number of error occurrences are equal to or greater than the reference value, the multiplexer 485 may provide the read data RMD to the demultiplexer 490.

The demultiplexer 490, in response to the operation mode signal OMS, may provide the I/O gating circuit 290 with an output of the multiplexer 485 in the scrubbing mode, and may provide the data I/O buffer 295 with the output of the multiplexer 485 in the read operation.

Figure 22:
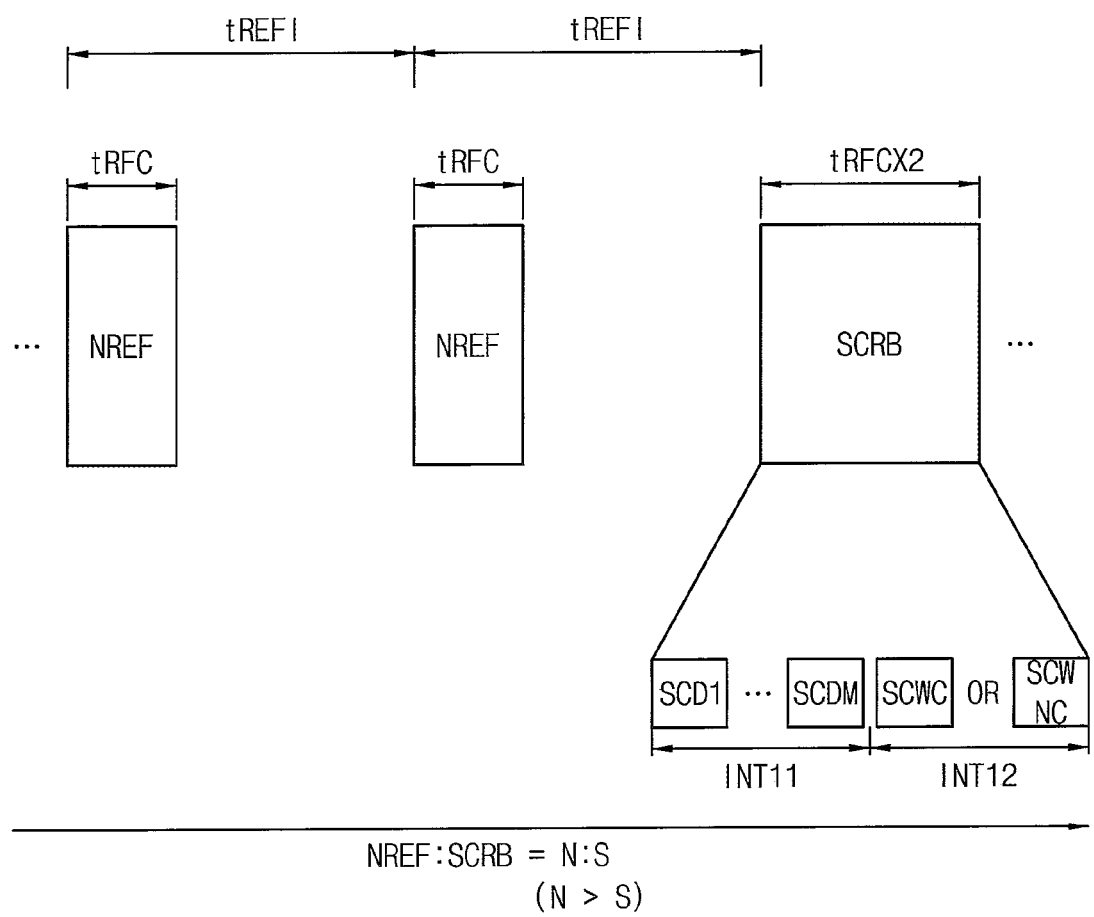
FIG. 22 illustrates that a normal refresh operation and a scrubbing operation are performed in the semiconductor memory device of FIG. 2 according to some example embodiments.

FIG. 22 illustrates how a normal refresh operation and a scrubbing operation may be performed in the semiconductor memory device of FIG. 2 according to some example embodiments.

In FIG. 22, tRFC may denote a refresh cycle and means a time for refreshing one memory cell row, and tREFI may denote a refresh interval and means an interval between two consecutive refresh commands.

Referring to FIG. 22, it is noted that the scrubbing control circuit 500 designates memory cell rows S times, on which the ECC circuit performs the scrubbing operation SCRB whenever the normal refresh operation REF is performed on memory cell rows N-times in response to the refresh command. S may be a natural number smaller than N.

The scrubbing operation SCRB on one memory cell row includes M scrubbing error detection operations SCD1~SCDM during a first interval INT11 and one of a scrubbing write back operation SCWC with writing back corrected data or a scrubbing write back operation SCW-NC with writing back uncorrected data during a second interval INT12.

The ECC circuit 400 in the semiconductor memory device 200 sequentially read data corresponding to a codeword from each of M sub-pages in the memory cell row (i.e., read M codewords), and perform error detection on the M codewords to count a number of error occurrences during the first interval INT11 of the scrubbing operation. The ECC circuit 400 may write back a corrected codeword or an uncorrected codeword based on the number of error occurrences during the second interval INT12 of the scrubbing operation.

When the counted number of error occurrences are equal to or greater than the reference value, a memory cell row including errors equal to or greater than the reference value has a high probability of occurrence of a row fault. Writing back a corrected codeword in a sub-page of the memory cell row in which the row fault occurs may generate a miscorrected error in the memory cell row in which the row fault occurs and correctable errors in the memory cell row may be changed to uncorrectable errors.

In the semiconductor memory device according to example embodiments, the ECC circuit 400 may skip an error correction on the memory cell row in which the row fault occurs and writes back the uncorrected codeword, which may prevent the correctable errors from being changed to uncorrectable errors. A sum of the first interval INT11 and the second interval INT12 may correspond to two times of the refresh cycle tRFC. The control logic circuit 210 may assign an interval for scrubbing operation during an interval corresponding to two times of the refresh cycle tRFC.

Figure 23A:
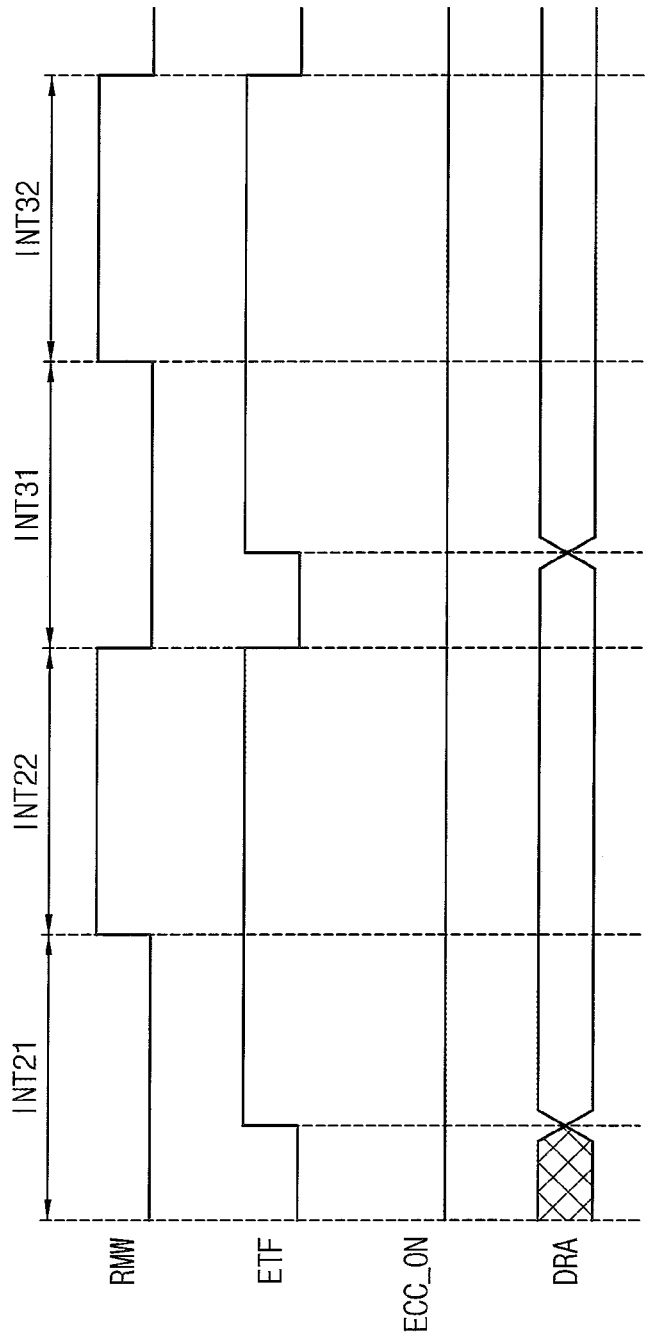
FIGS. 23A and 23B illustrate aspects of scrubbing operations performed in the semiconductor memory device of FIG. 2.
Figure 23B:
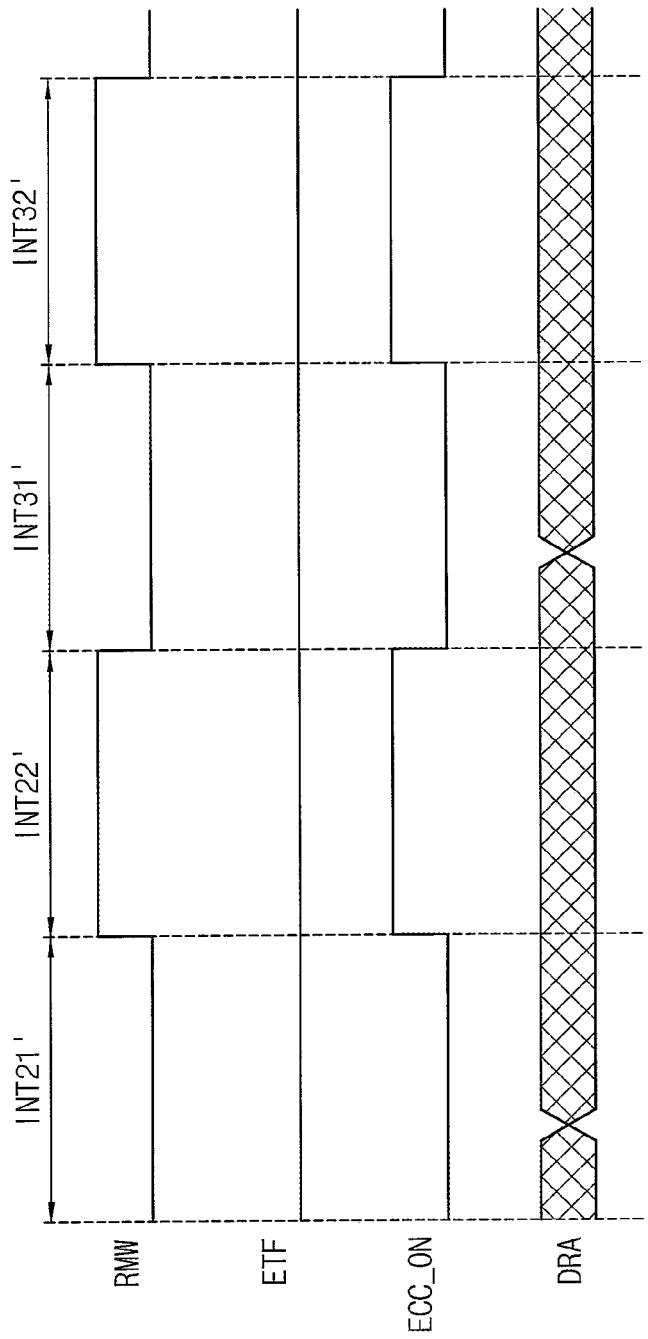

FIGS. 23A and 23B illustrate scrubbing operations performed in the semiconductor memory device of FIG. 2.

In FIGS. 23A and 23B, a signal RMW is a signal that identifies a first interval and a second interval of the scrubbing operation, and ECC ON represents an ECC decoding operation associated with writing back the corrected data.

Referring to FIGS. 2 and 23A, the ECC circuit 400 may perform error detection operation on a plurality of sub-pages in one memory cell row, and the ECC circuit 400 may count a number of error occurrences in a first interval INT21 of the scrubbing operation. The error threshold flag ETF may be transited to a high level when the counted number of error occurrences is equal to or greater than a reference value. The control logic circuit 210 may store in the fault address register 580 a row address DRA of the memory cell row in response to the error threshold flag ETF transitioning to a high level.

Since the error threshold flag ETF is a high level in a second interval INT22, the ECC circuit 400 may skip error correcting of the error bits, and as seen in FIG. 23 AECC_ON may have a low level in the second interval INT22. Operation on another memory cell row in each of a first interval INT31 and a second interval INT32 may be substantially the same as the described operations in each of the first interval INT21 and the second interval INT22.

Referring to FIGS. 2 and 23B, the ECC circuit 400 may perform error detection operation on a plurality of sub-pages in one memory cell row, and the ECC circuit 400 may count a number of error occurrences in a first interval INT21' of the scrubbing operation. The error threshold flag ETF may be maintained at a low level when the counted number of error occurrences is smaller than the reference value. The control logic circuit 210 does not store in the fault address register 580 a row address DRA of the memory cell row in response to the error threshold flag ETF being a low level.

Since the error threshold flag ETF is a low level in a second interval INT22', the ECC circuit 400 may correct the error bits, and as seen in FIG. 23B, ECC ON may have a high level in the second interval INT22'. The ECC circuit 400 may write back the corrected data. Operation on another memory cell row in each of a first interval INT31' and a second interval INT32' may be substantially the same as the described operation in each of the first interval INT21' and the second interval INT22'.

Figure 24:
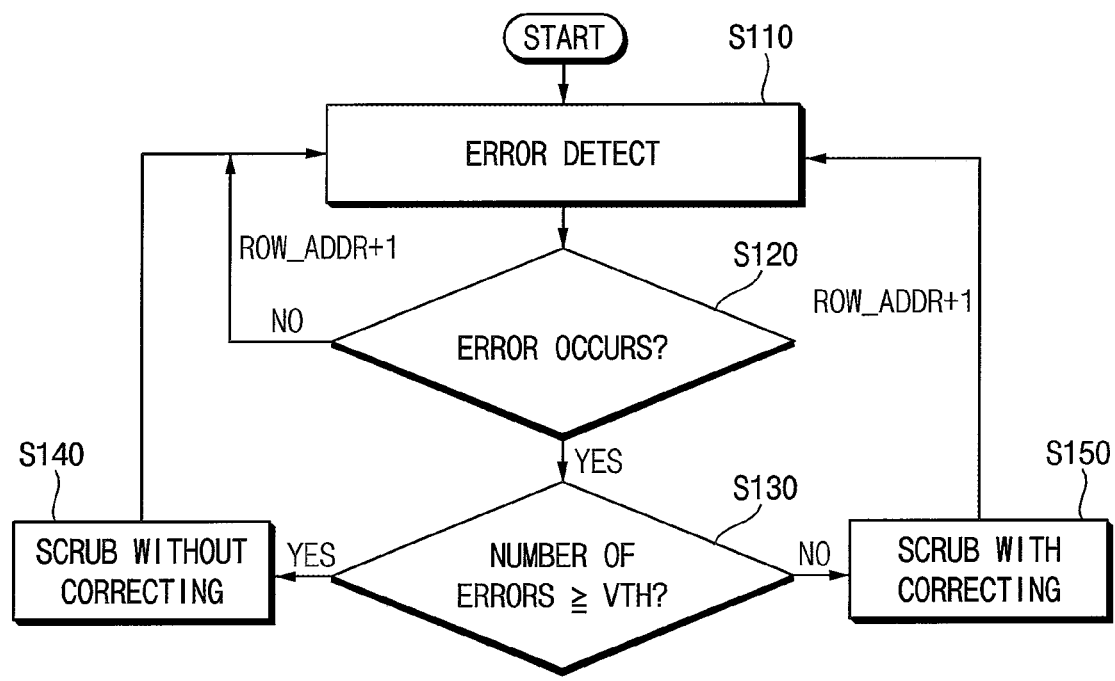
FIG. 24 is a flow chart illustrating a scrubbing operation according to some example embodiments.

FIG. 24 is a flow chart illustrating a scrubbing operation according to some example embodiments.

Referring to FIGS. 2 and 24, the ECC circuit 400 may perform an error detection operation on a first memory cell row (operation S110). The error detection operation may be performed by unit of codeword, that is codeword by codeword. The ECC circuit 400 may determine whether at least one error has occurred in the first memory cell row (operation S120). When no error has occurred in the first memory cell row (NO in operation S120), the control logic circuit 210 increases a row address by one and the ECC circuit 400 may perform an error detection operation on a second memory cell row.

When at least one error has occurred in the first memory cell row (YES in operation S120), the control logic circuit 210 then determines whether a number of error occurrences is equal to or greater than the reference value VTH (operation S130). When the number of error occurrences is equal to or greater than the reference value VTH (YES in operation S130), the ECC circuit 400 may perform a scrubbing operation by writing back the codeword without correcting the error. (operation S140). When the number of error occurrences is smaller than the reference value VTH (NO in operation S130), the ECC circuit 400 may perform a scrubbing operation by correcting the codeword and writing back the corrected codeword (operation S150).

Figure 25:
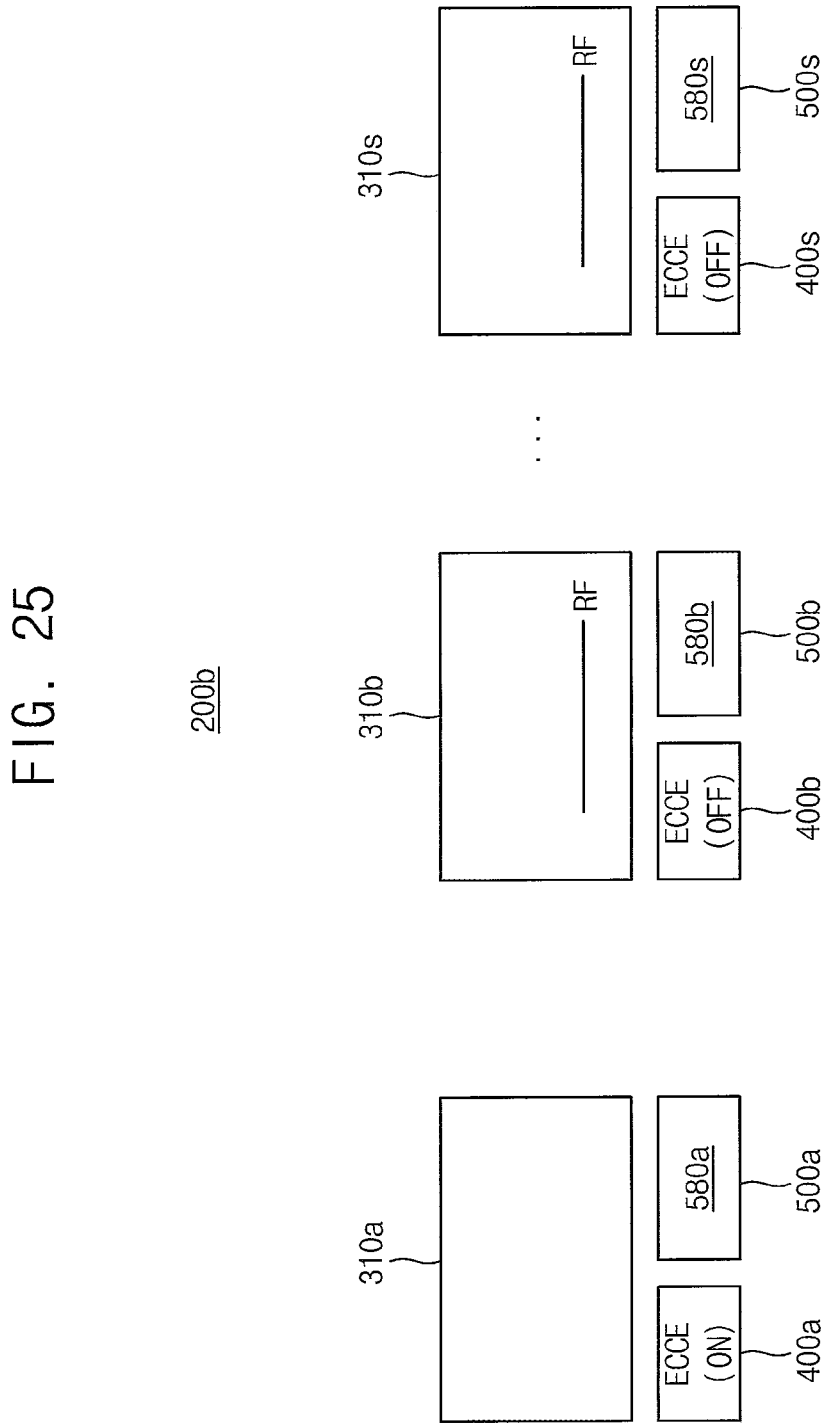
FIG. 25 is a block diagram illustrating a semiconductor memory device according to some example embodiments.

FIG. 25 is a block diagram illustrating a semiconductor memory device according to some example embodiments.

Referring to FIG. 25, a semiconductor memory device 200b is illustrated. The semiconductor memory device 200b includes a plurality of bank arrays 310a~310s, a plurality of ECC engines ECCE 400a~400s corresponding to the plurality of bank arrays 310a~310s and a plurality of sub fault address registers 580a~580s corresponding to the plurality of bank arrays 310a~310s. The plurality of ECC engines 400a~400s may correspond to the ECC engine 400 in FIG. 2 and the plurality of sub fault address registers 580a~580s may correspond to the fault address register 580 in FIG. 2.

The ECC engine 400a may perform a normal scrubbing operation on memory cell rows in bank array 310a because a memory cell row having a row fault is not detected in the bank array 310a. On the other hand, a memory cell row having a row fault RF may be detected in each of the bank arrays 310b and 310s, a row address of the memory cell row having the row fault RF in each of the bank arrays 310b and 310s may be stored in each of the sub fault address registers 580b and 580s as a row fault address, and each of the ECC engine 400b and 400s may perform a scrubbing operation by writing back codeword without correction of an error in a second interval of the scrubbing operation.

The control logic circuit 210 may control individually each of the ECC engines 400a~400s and each of the sub fault address registers 580a~580s, and the control logic circuit 210 may control each ECC engine 400a~400s and each sub fault address register 580a~580s based on detecting the row fault address register in the respective bank array of the plurality of bank arrays 310a~310s.

Figure 26:
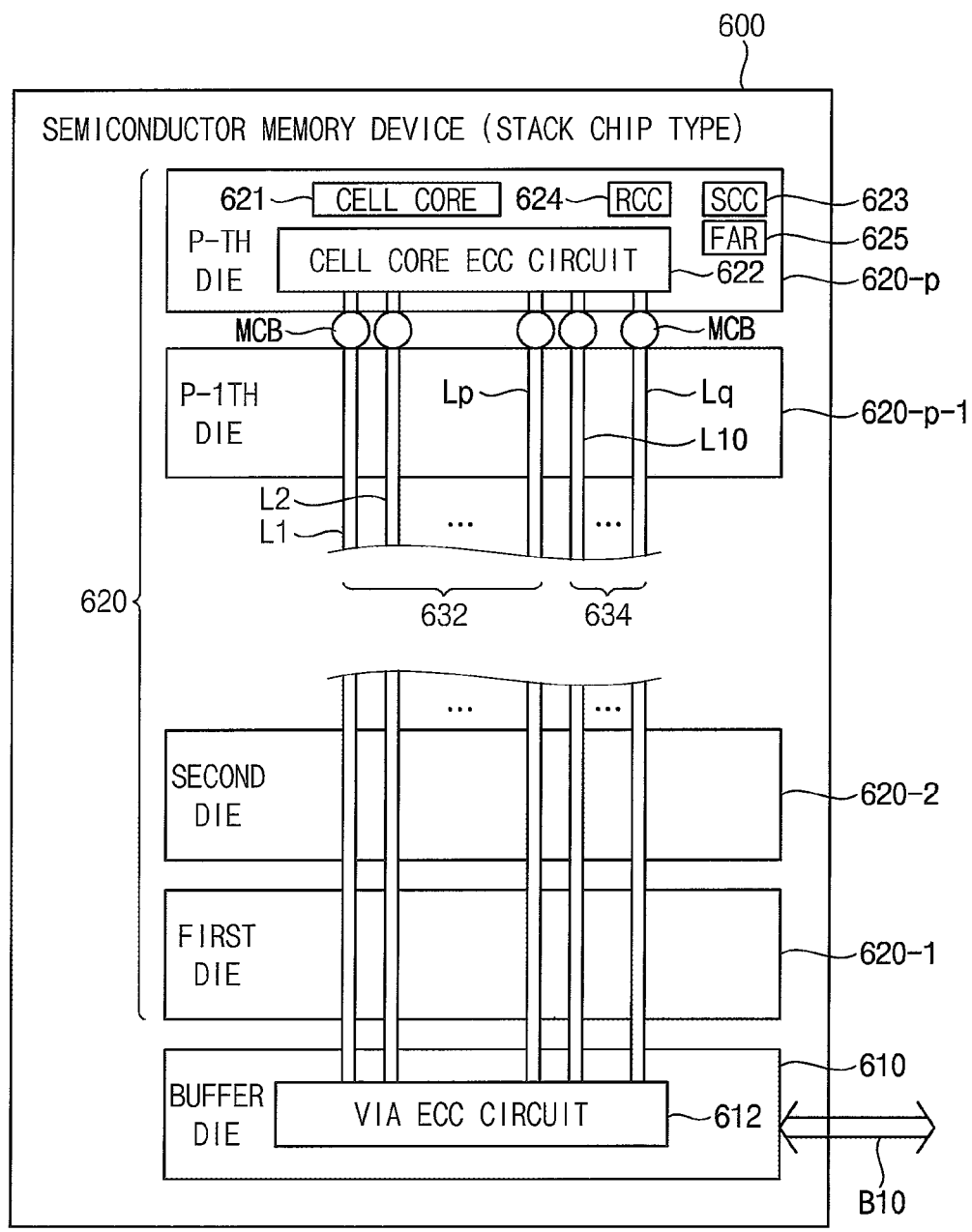
FIG. 26 is a block diagram illustrating a semiconductor memory device according to some example embodiments.

FIG. 26 is a block diagram illustrating a semiconductor memory device according to example embodiments.

Referring to FIG. 26, a semiconductor memory device 600 may include a buffer die 610 and group dies 620 configured to provide a soft error analyzing and correcting function in a stacked chip structure.

The group dies 620 may include a plurality of memory dies 620-1 to 620-p which is stacked on the buffer die 610 and conveys data through a plurality of through silicon via (TSV) lines.

At least one of the memory dies 620-1 to 620-p may include a cell core 621 including a memory cell array, an ECC circuit 622 which generates transmission parity bits (i.e., transmission parity data) based on transmission data to be sent to the buffer die 611, a refresh control circuit (RCC) 624, a scrubbing control circuit (SCC) 623 and a fault address register (FAR) 625. The ECC circuit 622 may be referred to as a 'cell core ECC circuit'.

The ECC circuit 622 may employ the ECC circuit 400 of FIG. 19. The refresh control circuit 624 may employ the refresh control circuit 385 of FIG. 4. The scrubbing control circuit 623 may employ the scrubbing control circuit 500 of FIG. 7 or the scrubbing control circuit 500a of FIG. 13.

The ECC circuit 622 and the scrubbing control circuit 623 may perform a scrubbing operation on memory cell rows in the memory die when a refresh operation is performed on the memory cell rows. The ECC circuit 622 may count a number of error occurrences in a first interval of the scrubbing operation, and may store a row address of the memory cell row in the fault address register 625 as a row fault address when the counted number of error occurrences is equal to or greater than the reference value in a first interval of the scrubbing operation, and the ECC circuit 622 may skip error correction in a second interval of the scrubbing operation. Therefore, the ECC circuit 622 may prevent or reduce generation of uncorrectable errors.

The buffer die 610 may include a via ECC circuit 612 which corrects a transmission error using the transmission parity bits when a transmission error is detected from the transmission data received through the TSV lines and which generates error-corrected data.

The semiconductor memory device 600 may be a stack chip type memory device or a stacked memory device which conveys data and control signals through the TSV lines. The TSV lines may be also called "through electrodes."

A data TSV line group 632 which is formed at one memory die 620-p may include TSV lines L1 to Lp, and a parity TSV line group 634 may include TSV lines L10 to Lq.

The TSV lines L1 to Lp of the data TSV line group 632 and the parity TSV lines L10 to Lq of the parity TSV line group 634 may be connected to micro bumps MCB which are correspondingly formed among the memory dies 620-1 to 620-p.

At least one of the memory dies 620-1 to 620-p may include DRAM cells each including at least one access transistor and one storage capacitor.

The semiconductor memory device 600 may have a three-dimensional (3D) chip structure or a 2.5D chip structure to communicate with the host through a data bus B10. The buffer die 610 may be connected with the memory controller through the data bus B10.

The via ECC circuit 612 may determine whether a transmission error has occurred on the transmission data received through the data TSV line group 632, based on the transmission parity bits received through the parity TSV line group 634. When a transmission error is detected, the via ECC circuit 612 may correct the transmission error on the transmission data using the transmission parity bits. When the transmission error is uncorrectable, the via ECC circuit 612 may output information indicating occurrence of an uncorrectable data error.

Figure 27:
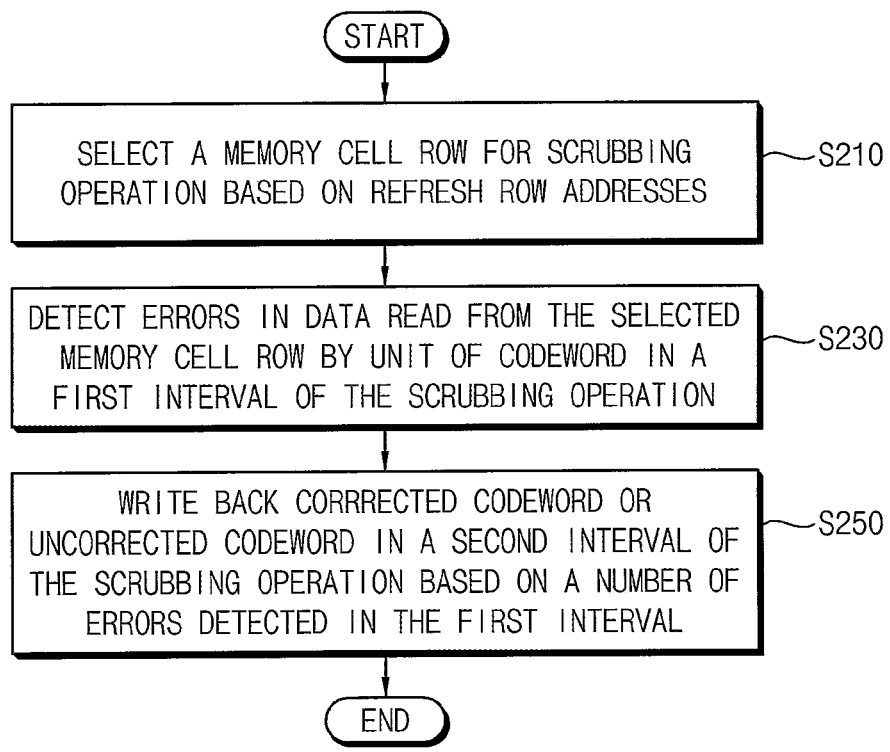
FIG. 27 is a flow chart illustrating a method of operating a semiconductor memory device according to some example embodiments

FIG. 27 is a flow chart illustrating a method of a semiconductor memory device according to some example embodiments.

Referring to FIGS. 2 through 27, in a method of operating a semiconductor memory device including a memory cell array 300 which includes a plurality of memory cell rows and each of the plurality of memory cell rows includes a plurality of volatile memory cells, a memory cell row may be selected for a scrubbing operation, with the memory cell row being selected from the plurality of memory cell rows based on refresh row addresses (operation S210). In some embodiments, the scrubbing control circuit 500 may generate a scrubbing address used for selecting the memory cell row by counting the refresh row addresses.

The ECC circuit 400 performs error detection operation on a plurality of sub-pages in the selected memory cell row to count a number of error occurrences in a first interval of the scrubbing operation (operation S230). The ECC circuit 400 either writes back a corrected codeword or writes back an uncorrected codeword based on the counted umber of error occurrences in a second interval of the scrubbing operation under control of the control logic circuit (operation S250).

The control logic circuit 210 may store a row address of the selected memory cell row in the fault address register 580 when the counted umber of error occurrences is equal to or greater than a reference value. When an access address associated with a read command is received from a source external to the memory device, it may be compared with the fault address register 580. If the access address matches a row fault address stored in the fault address register 580, the control logic circuit 210 may control the ECC circuit 400 to skip an ECC decoding on a memory cell row designated by the access address.

Figure 28:
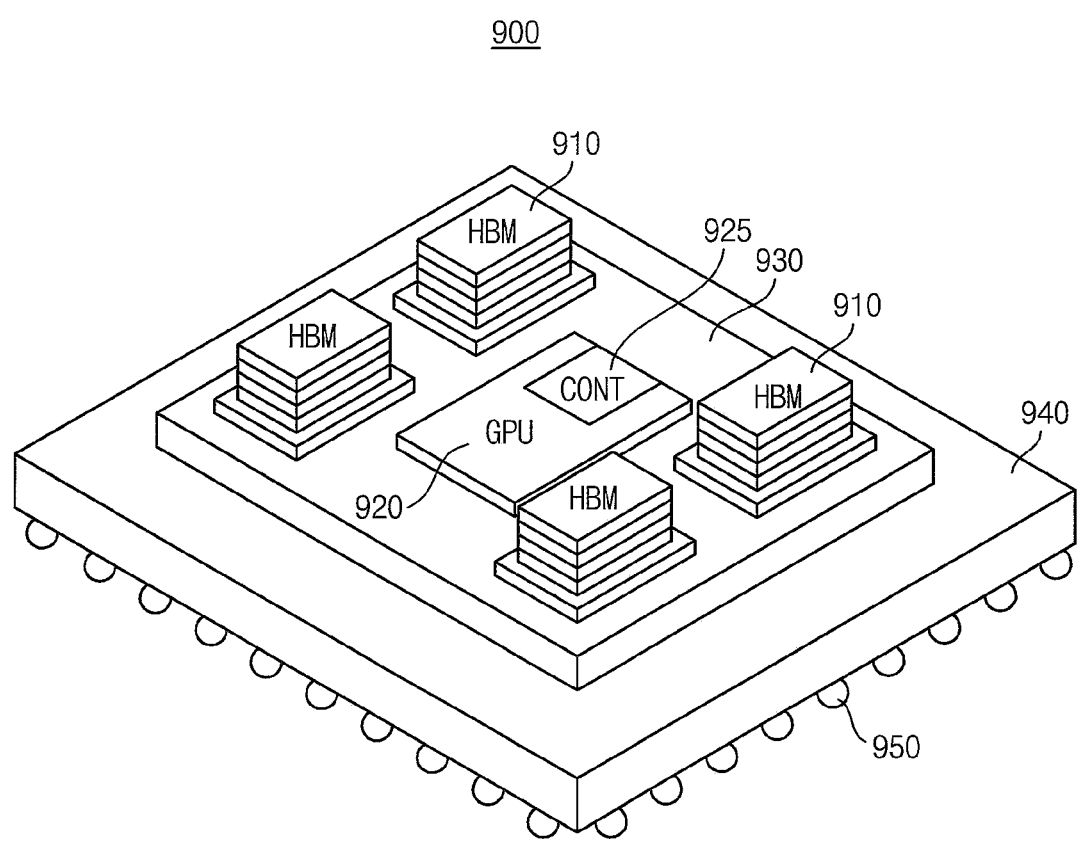
FIG. 28 is a diagram illustrating a semiconductor package including the stacked memory device, according to some example embodiments.

FIG. 28 is a diagram illustrating a semiconductor package including the stacked memory device, according to some example embodiments.

Referring to FIG. 28, a semiconductor package 900 may include one or more stacked memory devices 910 and a graphic processing unit (GPU) 920. The GPU 920 may include a memory controller 925.

The stacked memory devices 910 and the GPU 920 may be mounted on an interposer 930, and the interposer 930 may be mounted on a package substrate 940. The package substrate 940 may be mounted on solder balls 950. The memory controller 925 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies. Each of the memory dies may include a memory cell array, an ECC circuit, a scrubbing control circuit and a fault address register.

The GPU 920 may communicate with the one or more stacked memory devices 910. For example, each of the stacked memory devices 910 and the GPU 920 may include a physical region, and communication may be performed between each of the stacked memory devices 910 and the GPU 920 through the physical regions.

As mentioned above, according to some example embodiments, a semiconductor memory device may include an ECC circuit, a scrubbing control circuit and a fault address register. The ECC circuit performs error detection operation on codewords in a memory cell row designated by a scrubbing address provided from the scrubbing control circuit to count a number of error occurrences in a first interval of the scrubbing operation, and stores a row address of the memory cell row in the fault address register as a row fault address when the counted number of error occurrences is equal to or greater than the reference value. The ECC circuit also skips error correction and writes back an uncorrected codeword in second interval of the scrubbing operation when the counted number of error occurrences is equal to or greater than the reference value. Therefore, the semiconductor memory device may prevent error bits from being accumulated and may enhance device reliability, credibility, and/or performance.

Some aspects of the present inventive concepts may be applied to systems using semiconductor memory devices that employ an ECC circuit. For example, some aspects of the present inventive concepts may be applied to systems such as be a smart phone, a navigation system, a notebook computer, a desk top computer and a game console that use the semiconductor memory device as a working memory.

The foregoing is illustrative of some example embodiments of the present inventive concepts and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concept as defined in the claims.

What is claimed is:

1. A semiconductor memory device comprising:
a memory cell array including a plurality of memory cell rows, each of the plurality of memory cell rows including volatile memory cells;
an error correction code (ECC) circuit;
a fault address register;
a scrubbing control circuit configured to generate a scrubbing address for a scrubbing operation on a first memory cell row selected from the plurality of memory cell rows, wherein the scrubbing address is generated based on refresh operations performed on the plurality of memory cell rows; and
a control logic circuit configured to control the ECC circuit and the scrubbing control circuit,
wherein the control logic circuit is configured to:
control the ECC circuit such that the ECC circuit performs an error detection operation on a plurality of sub-pages in the first memory cell row to count a number of error occurrences in the first memory cell row during a first interval of the scrubbing operation;
selectively correct a codeword in which an error is detected based on the number of error occurrences in the first memory cell row, resulting in a corrected codeword or an uncorrected codeword;
write back the corrected codeword or the uncorrected codeword during a second interval of the scrubbing operation; and
store a row address of the first memory cell row in the fault address register as a row fault address in response to the number of error occurrences in the first memory cell row being equal to or greater than a reference value.

2. The semiconductor memory device of claim 1, wherein the control logic circuit is configured to control the ECC circuit to write back the corrected codeword in a corresponding sub-page in the first memory cell row in response to the number of error occurrences in the first memory cell row being smaller than the reference value.

3. The semiconductor memory device of claim 1, wherein the control logic circuit is configured to control the ECC circuit to not correct a codeword in which the error is detected and to write back the uncorrected codeword in a corresponding sub-page in the first memory cell row in response to the number of error occurrences being equal to or greater than the reference value.

4. The semiconductor memory device of claim 1, further comprising:
an address comparator configured to compare an access address from a source external to the semiconductor memory device with row fault addresses stored in the fault address register, and provide the control logic circuit with a match signal based on a result of the comparison.

5. The semiconductor memory device of claim 4, wherein the control logic circuit is configured to control the ECC circuit to skip an ECC decoding on a memory cell row designated by the access address when the access address is associated with a read command and when the match signal indicates that the access address matches the row fault address.

6. The semiconductor memory device of claim 4, wherein the address comparator is configured to provide the control logic circuit with the match signal based on processing at least some bits of each of the access address and the row fault address.

7. The semiconductor memory device of claim 1, wherein the control logic circuit is configured to store the row address of the first memory cell row in the fault address register as the row fault address when the number of error occurrences in the first memory cell row is equal to or greater than K, where K is an integer equal to or greater than three.

8. The semiconductor memory device of claim 1, wherein the scrubbing control circuit includes:
  a counter configured to count refresh row addresses and generate an internal scrubbing signal, wherein the counter is configured to activate the internal scrubbing signal based on the counter counting N refresh row addresses, N being an integer equal to or greater than two; and
  a scrubbing address generator configured to generate, in response to the internal scrubbing signal, a normal scrubbing address associated with a normal scrubbing operation on the first memory cell row.

9. The semiconductor memory device of claim 8,
  wherein the normal scrubbing address includes a scrubbing row address designating one memory cell row and a scrubbing column address designating one codeword included in the one memory cell row, and
  wherein the scrubbing address generator includes:
  a page segment counter configured to increment the scrubbing column address by one when the internal scrubbing signal is activated; and
  a row counter configured to increment the scrubbing row address by one when the scrubbing column address reaches a maximum value.

10. The semiconductor memory device of claim 1, wherein the scrubbing control circuit includes:
  a counter configured to count refresh row addresses and generate an internal scrubbing signal, wherein the counter is configured to activate the internal scrubbing signal based on the counter counting N refresh row addresses, N being an integer equal to or greater than two;
  a scrubbing address generator configured to generate a normal scrubbing address associated with a normal scrubbing operation for the first memory cell row in a first scrubbing mode, in response to the internal scrubbing signal and a scrubbing mode signal; and
  a weak codeword address generator configured to generate a weak codeword address associated with a weak scrubbing operation associated with weak codewords in the first memory cell row in a second scrubbing mode, in response to the internal scrubbing signal and the scrubbing mode signal.

11. The semiconductor memory device of claim 10, wherein the weak codeword address generator includes:
  an address storing table configured to store address information of the weak codewords; and
  a table pointer configured to generate a pointer signal that provides location information of the address storing table in response to the internal scrubbing signal.

12. The semiconductor memory device of claim 1, further comprising:
  a refresh control circuit configured to generate refresh row addresses in response to a refresh command received from an external source; and
  a fuse circuit configured to store the reference value and provide the reference value to the control logic circuit.

13. The semiconductor memory device of claim 1, wherein a sum of the first interval and the second internal corresponds to two times of a refresh cycle associated with a time interval for refreshing one memory cell row of the plurality of memory cell rows during a refresh operation.

14. The semiconductor memory device of claim 1, wherein the ECC circuit includes an ECC decoder configured to perform the error detection operation and an error correction operation on a plurality of codewords,
  wherein the ECC decoder includes:
  a data latch configured to store the plurality of codewords;
  a syndrome generation circuit configured to generate a syndrome based on a main data and a parity data of each of the plurality of codewords;
  an error locator configured to generate an error position signal indicating a position of at least one error bit in the main data, based on the syndrome; and
  a data corrector configured to receive codewords which are selected from the plurality of codewords stored in the data latch, based on the error position signal, and configured to correct an error bit in each of the selected codewords.

15. The semiconductor memory device of claim 1, wherein the control logic circuit is configured to perform a soft post package repair on a memory cell row designated by a row fault address stored in the fault address register by storing data stored in a memory cell row designated by the row fault address in a redundancy region of the memory cell array.

16. The semiconductor memory device of claim 1, wherein:
  the memory cell array includes a plurality of bank arrays;
  the ECC circuit includes a plurality of ECC engines corresponding to the plurality of bank arrays;
  the fault address register includes a plurality of sub fault address registers corresponding to the plurality of bank arrays; and
  the control logic circuit is configured to control each of the ECC engines and each of the sub fault address registers individually.

17. The semiconductor memory device of claim 1, comprising:
  at least one buffer die; and
  a plurality of memory dies stacked on the at least one buffer die and configured to convey data through a plurality of through silicon via (TSV) lines,
  wherein at least one of the plurality of memory dies includes the memory cell array, the ECC circuit, the scrubbing control circuit and a refresh control circuit configured to generate refresh row addresses based on the refresh operations.

18. A method of operating a semiconductor memory device including a memory cell array that includes a plurality of memory cell rows, each of the plurality of memory cell rows including a plurality of volatile memory cells, the method comprising:
  selecting a first memory cell row from the plurality of memory cell rows based on refresh row addresses for refreshing the memory cell rows;

performing, by an error correction code (ECC) circuit, an error detection operation on a plurality of sub-pages in the first memory cell row and counting a number of error occurrences in the first memory cell row;

determining whether to correct a codeword in which an error is detected based on the number of error occurrences in the first memory cell row; and writing back the codeword in which the error is detected to the memory cell array with or without correction based on the determining.

19. The method of claim 18, further comprising:

comparing the number of the error occurrences in the first memory cell row with a reference value;

storing a row address of the first memory cell row in a fault address register as a row fault address in response to the number of error occurrences in the first memory cell row being equal to or greater than the reference value; and skipping an ECC decoding on a memory cell row designated by an access address received from an external source when the access address matches a row fault address stored in the fault address register and when the access address is associated with a read command.

20. A semiconductor memory device comprising:

a memory cell array including a plurality of memory cell rows, each of the plurality of memory cell rows including volatile memory cells;

an error correction code (ECC) circuit;

a fault address register;

a refresh control circuit configured to generate refresh row addresses for refreshing the memory cell rows;

a scrubbing control circuit configured to generate, based on counting the refresh row addresses, scrubbing addresses for performing a scrubbing operation on a first memory cell row selected from the plurality of memory cell rows; and a control logic circuit configured to control the ECC circuit and the scrubbing control circuit, wherein the control logic circuit is configured to:

control the ECC circuit such that the ECC circuit performs an error detection operation on a plurality of sub-pages in the first memory cell row to count a number of error occurrences in the first memory cell row;

determine, based on the number of error occurrences in the first memory cell row, whether to correct a codeword in which an error is detected;

store a row address of the first memory cell row in the fault address register as a row fault address in response to the number of error occurrences in the first memory cell row being equal to or greater than a reference value; and control the ECC circuit to skip an ECC decoding on a memory cell row designated by an access address from an external source when the access address matches the row fault address and when the access address is associated with a read command.

* * * * *